US012772634B2

(12) United States Patent
Kim et al.

(10) Patent No.: US 12,772,634 B2
(45) Date of Patent: Oct. 20, 2026

(54) LIGHT-EMITTING STACKED PACKAGE HAVING DRIVING CIRCUIT PART, BACKLIGHT UNIT, AND METHOD OF FABRICATING LIGHT-EMITTING STACKED PACKAGE HAVING AND DRIVING CIRCUIT PART

(71) Applicant: Global Technologies Co., LTD, Hwaseong-si (KR)

(72) Inventors: Min Seon Kim, Hwaseong-si (KR); Yong Geun Kim, Suwon-si (KR)

(73) Assignee: Global Technologies Co., LTD, Hwaseong-si (KR)

( * ) Notice: Subject to any disclaimer, the term of this patent is extended or adjusted under 35 U.S.C. 154(b) by 721 days.

(21) Appl. No.: 18/114,756

(22) Filed: Feb. 27, 2023

(65) Prior Publication Data

US 2024/0290924 A1 Aug. 29, 2024

(30) Foreign Application Priority Data

Feb. 27, 2023 (KR) ........................ 10-2023-0026067

(51) Int. Cl.

| | |
|---|---|
| ***H10H 20/857*** | (2025.01) |
| ***H10H 20/01*** | (2025.01) |
| ***H10W 90/00*** | (2026.01) |

(52) U.S. Cl.

CPC .......... *H10H 20/857* (2025.01); *H10W 90/00* (2026.01); *H10H 20/0364* (2025.01)

(58) Field of Classification Search

CPC ............... H01L 25/167; H01L 25/0756; H01L 2224/023

See application file for complete search history.

(56) References Cited

U.S. PATENT DOCUMENTS

| | | | | |
|---|---|---|---|---|
| 8,780,023 | B2 | 7/2014 | Ootorii | |
| 9,006,973 | B2 | 4/2015 | Song | |
| 2012/0062115 | A1* | 3/2012 | Song | H10W 90/00 315/51 |
| 2019/0206833 | A1* | 7/2019 | Meyer | H01L 21/56 |
| 2021/0407962 | A1* | 12/2021 | Kim | H01L 23/5381 |
| 2022/0059605 | A1 | 2/2022 | Wu et al. | |

FOREIGN PATENT DOCUMENTS

| | | | | |
|---|---|---|---|---|
| JP | 2012-060133 A | 3/2012 | | |
| JP | 2012-227514 A | 11/2012 | | |
| JP | 2021-150557 A | 9/2021 | | |
| JP | 2022-041267 A | 3/2022 | | |
| KR | 10-2012-0026873 A | 3/2012 | | |
| WO | WO-2021102097 A1 * | 5/2021 | | H10D 86/441 |

* cited by examiner

*Primary Examiner* — Chad M Dicke
*Assistant Examiner* — Dave Tan
(74) *Attorney, Agent, or Firm* — Bridgeway IP Law Group, PLLC; Sang Ho Lee; Hyun Woo Shin

(57) ABSTRACT

Provided are a light-emitting stacked package having a driving circuit part which can be used for display or lighting, a backlight unit, and a method of fabricating the light-emitting stacked package having a driving circuit part. More particularly, the light-emitting stacked package having a driving circuit part includes a driving circuit part including at least one driving circuit; and a light-emitting element part including at least one light-emitting element seated on and electrically connected to the driving circuit part so as to be supplied with driving power from the driving circuit part.

14 Claims, 19 Drawing Sheets

LIGHT-EMITTING STACKED PACKAGE HAVING DRIVING CIRCUIT PART, BACKLIGHT UNIT, AND METHOD OF FABRICATING LIGHT-EMITTING STACKED PACKAGE HAVING AND DRIVING CIRCUIT PART

CROSS-REFERENCE TO RELATED APPLICATION

This application claims priority to Korean Patent Application No. 10-2023-0026067, filed on Feb. 27, 2023, in the Korean Intellectual Property Office, the disclosure of which is incorporated herein in its entirety by reference.

BACKGROUND OF THE INVENTION

1. Field of the Invention

The present disclosure relates to a light-emitting stacked package having a driving circuit part, a backlight unit, and a method of fabricating the light-emitting stacked package having a driving circuit part, and more particularly to a light-emitting stacked package having a driving circuit part which can be used for display or lighting, a backlight unit, and a method of fabricating the light-emitting stacked package having a driving circuit part.

2. Description of the Related Art

In general, a backlight light-emitting diode for display is a light-emitting device that converts electricity into light by using the properties of a compound semiconductor.

Using such a short-wavelength LED package, a white surface light source may be implemented by applying a sheet made of light conversion material onto a display surface, white light may be implemented by applying a light conversion material to a light-emitting diode package, or a light waveguide or light diffusion sheet for a surface light source may be added.

However, in the case of existing backlight units, RGB is always extracted from a white light source to express an image because a white backlight is always turned on when displaying color. Accordingly, when expressing a dark black color, there is a problem that some light leaks even on a black screen due to the technical limitation of not completely blocking the transmission of white light, greatly reducing the ability to implement black color.

To solve this existing problem, products capable of increasing black contrast by controlling color-changing backlight units with similar brightness have been developed, but they are not finely controlled as a screen resolution and it is possible only to control the brightness in a similar area.

Theoretically, perfect implementation is possible only when the light-emitting elements of the backlight are configured as many as the number of display pixels, but it is difficult to popularize due to the low manufacturing competitiveness due to the individual control technology of light-emitting elements and the increase in the cost of optical components, and the high cost of products due to high manufacturing production costs.

Recently, efforts have been made to implement black color using local dimming by increasing the number of light-emitting elements, but, since a light source should be used at a ratio of 1/800 of pixels, for example, for local dimming of a large display of 8 million pixels, there is a problem that the number of blocks drops significantly to a level of 1/8000 due to the density of a substrate pattern for dimming control or difficulty in manufacturing.

Accordingly, when constructing a large number of light-emitting elements and a large number of local dimming blocks on a display plane, optical and electrical arrangements between light-emitting sources and control components such as drive ICs that control the brightness of a large number of lights by binding specific areas are required, and the circuit configuration on a substrate for electrical control is complicated, so an increase in the cost of materials and manufacturing process cannot be prevented.

In addition, a large number of components should be mounted on a surface where a light emitting source is mounted, and these components increase light loss preventing light reflection and re-reflection in implementing a surface light source due to the characteristics of a backlight, whereby there is a problem in that it is impossible to manufacture due to design restrictions in constructing a uniform surface light source.

That is, when a light-emitting element such as a light-emitting diode is disposed in an existing display device, drive ICs for controlling each light-emitting element must be disposed around the light-emitting elements, so the light-emitting elements as well as control parts such as a number of drive ICs must be mounted using different processes, which increases circuit complexity, requires a multi-layered (both sides or more) complicated driving substrate, or inevitably increases a defect rate between processes because a large number of parts are subjected to multiple processes to manufacture a backlight module.

In addition, in the case of the existing technology to implement a surface light source, more LEDs than the number of local dimming are bound into blocks and densely arranged to match the light uniformity, or a simple dome-shaped optical system is provided to improve light extraction and uniformity, but there is a limit in implementing a uniform surface light source. Accordingly, it is difficult to manufacture a backlight module with a thin thickness, and if the number of light-emitting diodes is reduced, a thicker optical distance is required, which inevitably results in a thicker backlight optical system and increases in internal light loss, resulting in increased power consumption.

SUMMARY OF THE INVENTION

Therefore, the present disclosure has been made in view of the above problems, and it is one object of the present disclosure to provide a light-emitting stacked package having a driving circuit part, a backlight unit, and a method of fabricating the light-emitting stacked package having a driving circuit part, the light-emitting stacked package being capable of realizing a local dimming backlight including a plurality of control elements by mounting a light-emitting element on a semiconductor chip on which a driving circuit is formed and, accordingly, significantly improving light extraction efficiency by reducing a wiring length, implementing an ultra-thin display, designing an ultra-thin package of multicolor or monochromatic light-emitting diodes with a minimized number of parts, improving optical characteristics, such as widening a light beam angle, by forming various optical systems, realizing a uniform surface light source, maximizing a black-and-white contrast ratio, and dramatically improving difficulties, such as mounting space constraints, circuit complexity, and increasing unit cost, when manufacturing modules. It will be understood that the technical problems are only provided as examples, and the scope of the present disclosure is not limited thereto.

In accordance with an aspect of the present disclosure, the above and other objects can be accomplished by the provision of a light-emitting stacked package having a driving circuit part, the light-emitting stacked package including: a driving circuit part including at least one driving circuit; and a light-emitting element part including at least one light-emitting element seated on and electrically connected to the driving circuit part so as to be supplied with driving power from the driving circuit part.

In addition, according to the present disclosure, the driving circuit part may include a semiconductor substrate formed on a semiconductor wafer using an integrated circuit process.

In addition, according to the present disclosure, the driving circuit part may further include: at least one first terminal formed on one surface of the semiconductor substrate and configured to receive power signals or input/output signals; and at least one second terminal formed on another surface of the semiconductor substrate, provided with a mounting surface on which the light-emitting element is mounted, and electrically connected to the first terminal or the driving circuit.

In addition, according to the present disclosure, the driving circuit part may further include at least one first through electrode formed in a shape penetrating the semiconductor substrate or along a side surface of the semiconductor substrate such that the first terminal and the second terminal are electrically connected.

In addition, according to the present disclosure, the first terminal may be disposed on an edge portion of one surface of the semiconductor substrate such that the first through electrode is formed to avoid the driving circuit formed in a central portion of the semiconductor substrate or formed on a side surface of the semiconductor substrate.

In addition, according to the present disclosure, the driving circuit part may further include a redistribution insulating layer formed between the second terminal and the first through electrode and may be configured to include a redistribution pad connected to the first through electrode.

In addition, according to the present disclosure, the driving circuit part may further include a second through electrode formed in a shape penetrating the redistribution insulating layer such that the redistribution pad and the second terminal are electrically connected and formed in a shape that is out of sync with the first through electrode to mitigate internal and external shocks.

In addition, according to the present disclosure, in the first through electrode, a first width of a first portion connected to the first terminal may be formed wider than a second width of a second portion connected to the redistribution pad.

In addition, according to the present disclosure, a fourth width of a fourth portion connected to the redistribution pad may be formed narrower than a third width of a third portion connected to the second terminal.

In addition, according to the present disclosure, the first terminal may include at least one of a power terminal, a driving voltage terminal, a control terminal, a feedback terminal, a brightness adjustment terminal, a light intensity correction terminal, a dummy terminal and combinations thereof.

In addition, according to the present disclosure, the first terminal may include: a first terminal set composed of at least one of a power terminal, a driving voltage terminal, a control terminal, a feedback terminal, a brightness adjustment terminal, a light intensity correction terminal, a dummy terminal and combinations thereof; and a second terminal set symmetrically arranged on a side opposite to the first terminal set and composed of a combination of terminals identical to the first terminal set or including a part of the first terminal set.

In addition, according to the present disclosure, the second terminal may include a first electrode connected to a first pad of the light-emitting element; and a second electrode formed to be spaced apart from the first electrode by using an electrode separation space and connected to a second pad of the light-emitting element.

In addition, according to the present disclosure, a plurality of light-emitting elements may be connected in parallel between the first electrode and the second electrode or connected in series between the first electrode and the second electrode using at least one bridge electrode.

In addition, according to the present disclosure, the light-emitting element part may include: the light-emitting element, which is a flip chip type LED, including a first pad and second pad formed on a lower surface thereof; and a protective member serving to protect the light-emitting element.

In addition, according to the present disclosure, the protective member may include at least one of a light-transmitting molding member made of a light-transmitting material including silicone or epoxy; a lens member; a light conversion member including a fluorescent material or quantum dot; a color filter member; an optical system; a reflective wall member; and combinations thereof.

In accordance with another aspect of the present disclosure, there is provided a backlight unit, including: a plurality of light-emitting stacked packages as disclosed in claim 1; and a printed circuit substrate including at least one wiring layer connected to terminals of the light-emitting stacked packages.

In accordance with yet another aspect of the present disclosure, there is provided a method of fabricating a light-emitting stacked package having a driving circuit part, the method including: (a) preparing a driving circuit part including at least one driving circuit; and (b) forming a light-emitting element part including at least one light-emitting element mounted on and connected electrically to the driving circuit part to receive driving power from the driving circuit part.

In addition, according to the present disclosure, the preparing (a) may include: (a-1) forming a semiconductor substrate on a semiconductor wafer using an integrated circuit process; (a-2) forming at least one first terminal, which receives a power signal or an input/output signal, on one surface of the semiconductor substrate; and (a-3) forming at least one second terminal provided with a mounting surface to mount the light-emitting element on another surface of the semiconductor substrate and electrically connected to the first terminals or the driving circuit.

In addition, according to the present disclosure, the preparing (a) may further include (a-4) forming at least one first through electrode in a shape penetrating the semiconductor substrate or along a side surface of the semiconductor substrate so that the first terminals and the second terminal are electrically connected, after the forming (a-2).

In addition, according to the present disclosure, the forming (b) may include: (b-1) chip-bonding or transferring the light-emitting element, which is a flip chip type LED, to the second terminal of the semiconductor substrate; (b-2) performing reflow or laser soldering such that the second terminal and pads of the light-emitting element are electrically connected; (b-3) injection-molding a protective member on the light-emitting element or dispensing the protective member thereon by squeezing or coating; and (b-4) cutting the semiconductor wafer W and the protective member into a plurality of unit packages along a cutting line with a blade or a laser.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE INVENTION

Figure 1:
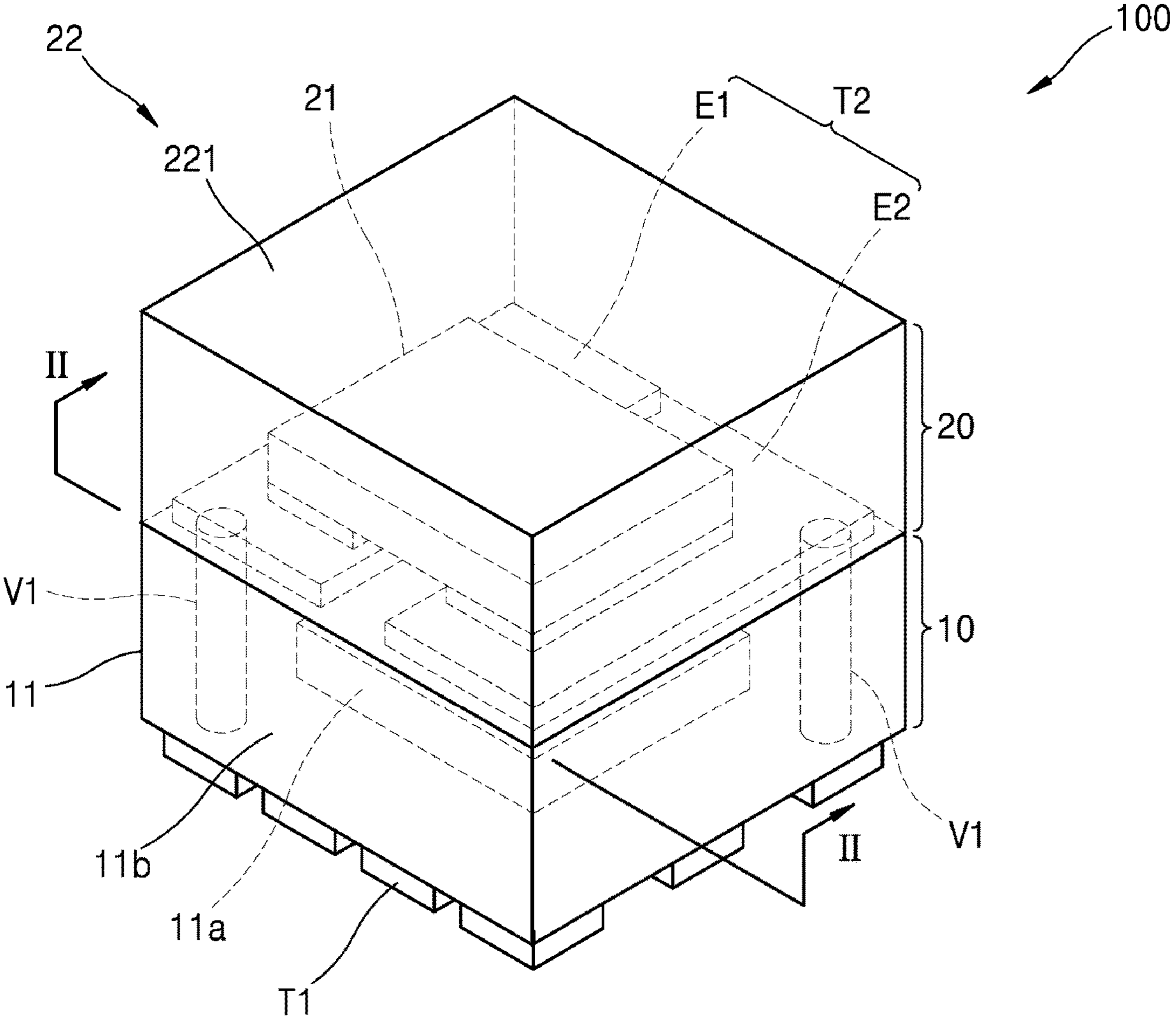
FIG. 1 is a perspective view illustrating a light-emitting stacked package having a driving circuit part according to some embodiments of the present disclosure.

Hereinafter, one or more preferred embodiments of the present disclosure will be described in detail with reference to the accompanying drawings.

Embodiments of the present disclosure are provided to more completely explain the present disclosure to those skilled in the art, and the following embodiments may be modified in many different forms, but the scope of the present disclosure is not limited to the following embodiments. Rather, the embodiments are provided to make the disclosure thorough and complete and to fully convey the technical idea of the disclosure to those skilled in the art. In the drawings, the thicknesses and sizes of layers may be exaggerated for convenience and clarity of explanation.

It will be understood that when an element, such as a layer, a region, or a substrate, is referred to as being "on," "connected to," "stacked on" or "coupled to" another element, it may be directly on, connected to, stacked on, or coupled to the other element or intervening elements may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present disclosure.

A Chip Scale Package (CSP) mentioned in the present disclosure is a technology for forming a light-emitting device package on a chip scale basis and is characterized by mounting a large number of light-emitting elements on a substrate, applying a phosphor in a lump, and then constituting a package through singulation.

Here, the size of the CSP is almost similar to that of a light-emitting device or has a slightly larger size within a range of 20%. Such a package does not require an additional submount or substrate and may be directly connected to a board.

In addition, the CSP is a Surface Mount Device (SMD) with a PN junction, and has a simple bonding pad space, enabling standard testing without additional complicated processes.

Compared to existing light-emitting device packages, the CSP is small, can be formed at high densities to lower costs, and has advantages such as simple processing, heat resistance, and high color uniformity.

Figure 2:
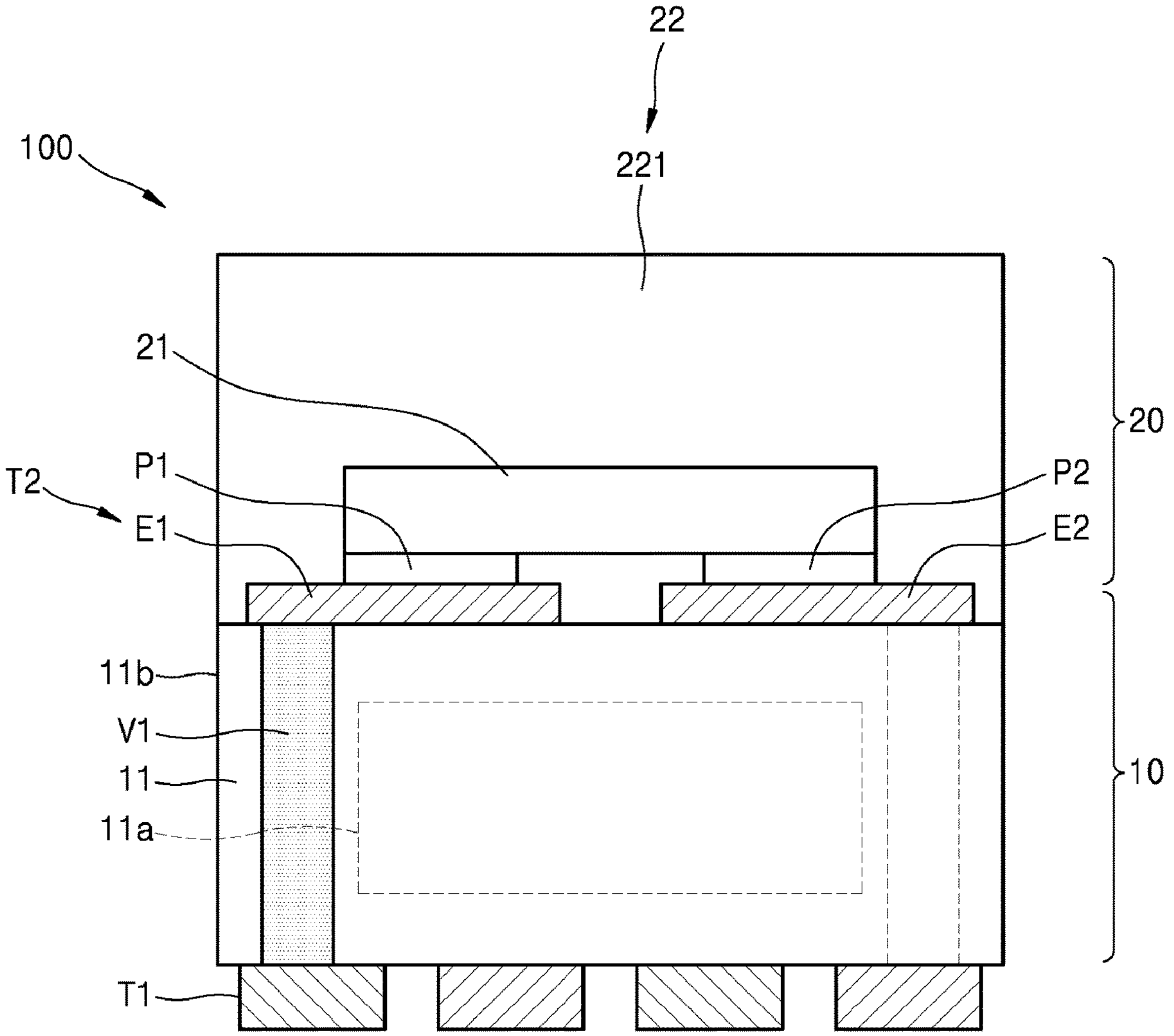
FIG. 2 illustrates a sectional view taken along line II-II of the light-emitting stacked package having a driving circuit part of FIG. 1.
Figure 3:
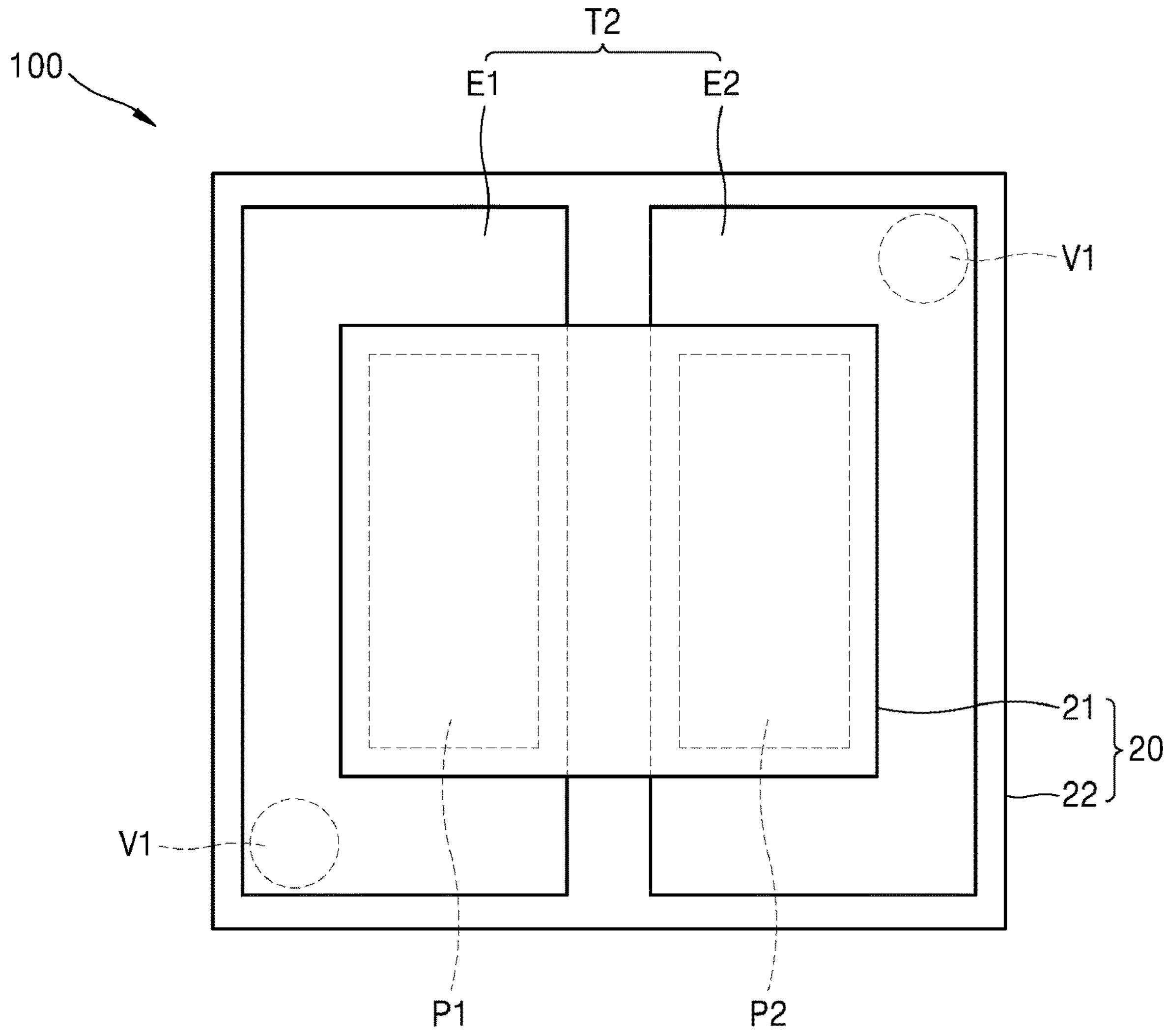
FIG. 3 is a plan view illustrating a light-emitting element of the light-emitting stacked package having a driving circuit part of FIG. 1.
Figure 4:
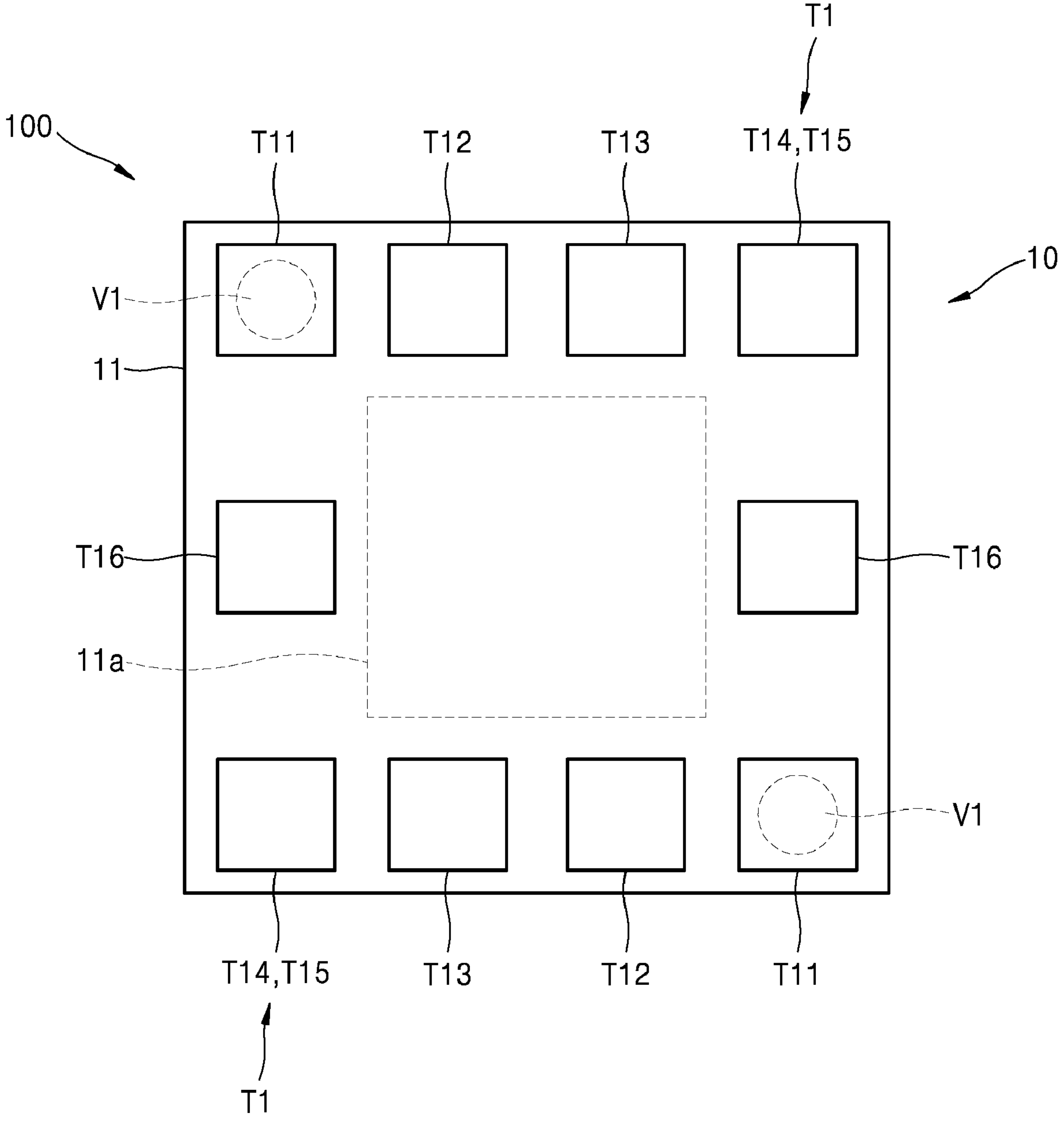
FIG. 4 is a bottom view illustrating first terminals of the light-emitting stacked package having a driving circuit part of FIG. 1.
Figure 5:
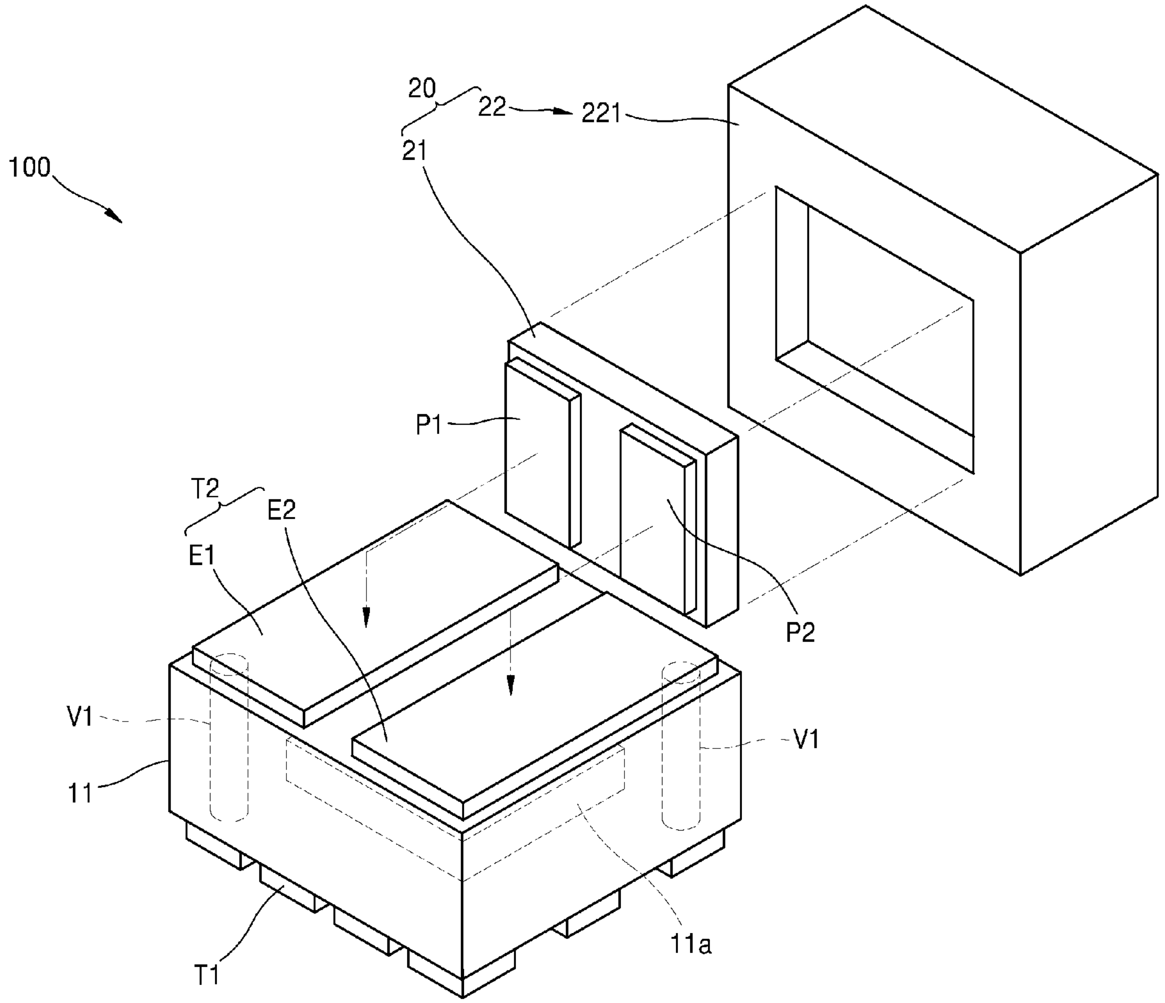
FIG. 5 illustrates an exploded perspective component view of the light-emitting stacked package having a driving circuit part of FIG. 1.

FIG. 1 is a perspective view illustrating a light-emitting stacked package having a driving circuit part 100 according to some embodiments of the present disclosure; FIG. 2 illustrates a sectional view taken along line II-II of the light-emitting stacked package having a driving circuit part 100 of FIG. 1; FIG. 3 is a plan view illustrating a light-emitting element 21 of the light-emitting stacked package having a driving circuit part 100 of FIG. 1; FIG. 4 is a bottom view illustrating first terminals T1 of the light-emitting stacked package having a driving circuit part 100 of FIG. 1; and FIG. 5 illustrates an exploded perspective component view of the light-emitting stacked package having a driving circuit part 100 of FIG. 1.

First, as shown in FIGS. 1 to 5, the light-emitting stacked package having a driving circuit part 100 according to some embodiments of the present disclosure may largely include a driving circuit part 10 that functions as a kind of drive IC; and a light-emitting element 20 driven by the driving circuit part 10.

For example, the driving circuit part 10 includes at least one driving circuit 11*a* that is responsible for the function of a kind of drive IC, and the driving circuit 11*a* may include various types of circuits that supply power, control a driving voltage, process a feedback signal, control the driving brightness of the light-emitting element 20, or correct the amount of light of the light-emitting element 20 according to the standard amount of light of other light-emitting elements.

As a more specific example, the driving circuit part 10 may include a semiconductor substrate 11 formed on a semiconductor wafer W, such as a silicon wafer, using an integrated circuit process, as shown in FIGS. 1 to 5.

The semiconductor substrate 11 may be formed of multiple layers of semiconductor material, and a metal ReDistribution Layer (RDL) may be used for electrical connection of the driving circuits 11*a* formed on each layer.

The driving circuit part 10 may further include at least one second terminal T2 that is formed on one surface of the semiconductor substrate 11 for signal input and output of the driving circuit 11*a*, formed on other surfaces of the at least one first terminal T1 receiving power signals or input/output signals and the semiconductor substrate 11, provided with a mounting surface on which a light-emitting element 21 is mounted, or electrically connected to the first terminals T1 or the driving circuit 11*a*.

Here, the terminals T1 and T2 may be applied with electrically conductive materials, such as Cu, Ni, Ag, Au, etc., which have excellent electrical conductivity, and may be applied in the form of various types of solder, bumps, or pads.

As a more specific example, the first terminals T1 may include at least one of a power terminal T11, a driving voltage terminal T12, a control terminal T13, a feedback terminal T14, a brightness adjustment terminal T15, a light intensity correction terminal T16, a dummy terminal (not shown) and combinations thereof.

Here, when a light-emitting stacked package 100 of the present disclosure is mounted on a printed circuit substrate, which is to be described below, as a driving circuit to enable dramatic cost reduction, a wiring of the substrate is composed of a single layer rather than a multilayer and at least one dummy terminal for extension may be used, thereby simplifying a circuit wiring when individually controlling the plural light-emitting elements 21.

In addition, for example, the second terminal T2 may include a first electrode E1 connected to a first pad P1 of the light-emitting element 21; and a second electrode E2 formed to be spaced apart from the first electrode E1 by using an electrode separation space and connected to a second pad P2 of the light-emitting element 21.

Here, the first and second electrodes E1 and E2 of the second terminal T2 may be formed to protrude upward to enable an electrical test using a probe card before the light-emitting element 21 is mounted.

As a more specific example, an anti-oxidation layer for preventing oxidation or a reflective layer for reflecting light generated from the light-emitting element 21 upward may be formed on surfaces of the first and second electrodes E1 and E2 of the second terminal T2.

Accordingly, the light-emitting stacked package 100 of the present disclosure may enable individual control of each light source to increase a contrast ratio, thereby enabling more local dimming with fewer light sources, may provide a light source-integrated light source that implements a light beam angle to provide a uniform surface light source, may increase internal re-reflectance by maximizing the area of a reflective layer or reflective sheet for improving light extraction in an area other than a light-emitting element because components are minimized on a light emitting surface and a controller and a light emitting source are integrated into a minimized size, may enable uniform light mixing, may allow easy manufacturing by reducing the number of existing components due to a built-in control function, and may greatly reduce other material costs.

In addition, for example, the driving circuit part 10 may further include at least one first through electrode V1 formed in a cylindrical or polygonal column shape penetrating the semiconductor substrate 11 so that the first terminals T1 and the second terminal T2 are electrically connected to each other.

Here, the first terminals T1 may be disposed on an edge portion of one surface of the semiconductor substrate 11 such that the first through electrode V1 is formed to avoid the driving circuit 11*a* formed in the central portion of the semiconductor substrate 11 or formed on a side surface 11*b* of the semiconductor substrate 11.

Meanwhile, for example, a light-emitting element part 20 may include at least one light-emitting element 21 seated on and electrically connected to the driving circuit part 10 so as to receive driving power from the driving circuit part 10, as shown in FIGS. 1 to 5.

As a more specific example, the light-emitting element part 20 may include the light-emitting element 21 that is a Light Emitting Diode (LED), on the bottom of which the first pad P1 and the second pad P2 are formed, in the form of a flip chip; and a protective member 22 for protecting the light-emitting element 21.

Here, the light-emitting element 21 may be applied with a blue LED or white LED in the form of a flip chip without being necessarily limited thereto, may be applied with a non-flip LED chip on which a pad is formed or with an inorganic LED Chip having various colors in the form of a flip chip, or may be configured by combining several LED chips with a driving circuit part that drives the LED chips. The light-emitting element 21 may be applied to all types of LEDs, such as mini LEDs or micro LEDs, as well as general LEDs.

That is, although not shown, a light-emitting element wherein a bonding wire is applied to a terminal or a bonding wire is partially applied only to a first terminal or a second terminal, a horizontal or vertical light-emitting element, or the like may be applied, but a flip chip type may be preferable to realize miniaturization and ultra-thinness of a product.

The light-emitting element 21 is configured by epitaxially growing a nitride semiconductor such as InN, AlN, InGaN, AlGaN, InGaAlN, or the like on a sapphire substrate or a silicon carbide substrate for growth by, for example, a vapor deposition method such as MOCVD. In addition, the light-emitting element 21 may be formed using semiconductors such as ZnO, ZnS, ZnSe, SiC, GaP, GaAlAs, and AlInGaP in addition to a nitride semiconductor. As these semiconductors, a laminate formed in the order of an n-type semiconductor layer, a light emitting layer, and a p-type semiconductor layer may be used. For a light emitting layer (active layer), a multilayer semiconductor having a multi-quantum well structure or a single quantum well structure, or a stacked semiconductor having a double heterostructure may be used. In addition, the light-emitting element 21 may have a certain wavelength according to a purpose such as a display purpose or a lighting purpose.

Here, as the substrate for growth, an insulating, conductive or semiconductor substrate may be used as needed. For example, the substrate for growth may be sapphire, SiC, Si, $MgAl_2O_4$, MgO, $LiAlO_2$, $LiGaO_2$, GaN. For epitaxial growth of a GaN material, a GaN substrate, which is a homogeneous substrate, may be applied.

Further, the protective member 22 may be a light-transmitting molding member 221 formed by casting a light-transmitting material including at least silicon or epoxy.

However, the protective member 22 is not limited to the light-transmitting molding member 221, and a light conversion member including a fluorescent material or quantum dot, a color filter member, an optical system, a reflective wall member, etc. may be applied.

Here, the fluorescent material should basically conform to stoichiometry, and each element may be substituted with another element in each group of the periodic table. For example, Sr may be substituted with alkaline earth (II) group Ba, Ca, Mg, etc., and Y may be substituted with lanthanide group Tb, Lu, Sc, Gd, etc. In addition, Eu, etc., which is an activator, may be substituted with Ce, Tb, Pr, Er, Yb, etc. according to the desired energy level, and the activator may be used alone or an auxiliary activator may be additionally applied to modify properties.

In addition, quantum dots may be nanometer-sized particles that have optical properties arising from quantum confinement and may include, for example, one or more of Group IV element, Group II-VI compound, Group II-V compound, Group III-VI compound, Group III-V compound, Group IV-VI compound, Group I-III-VI compound, Group II-IV-VI compound, and Group II-IV-V compounds.

Quantum dots may include one or more of ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InP, InSb, AlAs, AlN, AlP, AlSb, TlN, TlP, TlAs, TlSb, PbO, PbS, PbSe, PbTe, Ge and Si.

In addition, quantum dots may be composed of a core (3 to 10 nm) of CdSe or InP, a shell (0.5 to 2 nm) of ZnS or ZnSe, and a ligand structure for stabilizing the core or the shell and may have optical properties capable of implementing various colors depending on the size thereof.

In addition, quantum dots may include a monomer that may be included in a physical structure or other forms and may be polymerized into a desired physical structure such as a film.

As a more specific example, quantum dots may be injected and hardened in a paste form together with various binders, in addition to a sheet form, or may be formed in various fluid forms such as other liquid states or gel states.

In addition, the light conversion member may include two or more types of phosphors having different emission wavelengths and a quantum dot material and may be used by mixing the phosphors and the quantum dot material.

Accordingly, according to an operation process of the light-emitting stacked package having a driving circuit part 100 according to some embodiments of the present disclosure as shown in FIGS. 1 to 5, external input/output signals may be input to the driving circuit 11*a* through the driving voltage terminal T12, the control terminal T13, the feedback terminal T14, the brightness adjustment terminal T15, the light intensity correction terminal T16, a dummy terminal (not shown), etc. of the first terminals T1 formed on a bottom surface of the driving circuit part 10, and a final output power signal passing through the driving circuit 11*a* may be applied to the power terminals T11 on both sides of the first terminals T1 to pass through a semiconductor substrate 11 via the first through electrode V1 and may be applied to the first and second electrodes E1 and E2 of the second terminal T2 formed on a top surface of the driving circuit part 10.

Next, the output power signal may be supplied to the light-emitting element 21 through the first pad P1 and the second pad P2 respectively connected to the first and second electrodes E1 and E2, and when light is generated by the light-emitting element 21 to which the output power signal is applied, a light path may be guided by the protective member 22 surrounding the light-emitting element 21 or light conversion may be performed to convert the wavelength of light.

Here, when the light-emitting element 21 is a blue LED, the protective member 22 may be a light conversion member including a fluorescent material or quantum dots.

Therefore, a local dimming backlight including a plurality of control elements may be realized by mounting the light-emitting element 21 on the semiconductor substrate 11, on which the driving circuit 11*a* is formed, through the Chip Scale Package (CSP) process so that light extraction efficiency may be greatly improved by reducing a wiring length, it is possible to implement a thin display and design an ultra-thin package of multicolor or monochromatic light-emitting diodes with a minimum number of components by minimizing the optical distance of the backlight, a light beam angle may be improved by forming various optical systems such as a light-diffusing lens or a side-reflection type optical system on a light-emitting surface, a thinner and more uniform surface light source may be realized with fewer light-emitting devices, a black-and-white contrast ratio (black contrast) may be maximized by realizing multiple local dimming with the same local dimming number and light source number, difficulties such as mounting space limitations, circuit complexity, and unit price increase when manufacturing modules may be dramatically reduced, more levels of contrast ratio may be achieved by including a control element (drive circuit) with a structure that maximizes the control level of light brightness, and a feedback terminal and terminals, power and ground terminals for multiple functions, etc. may be configured in various ways for accurate control.

Figure 6:
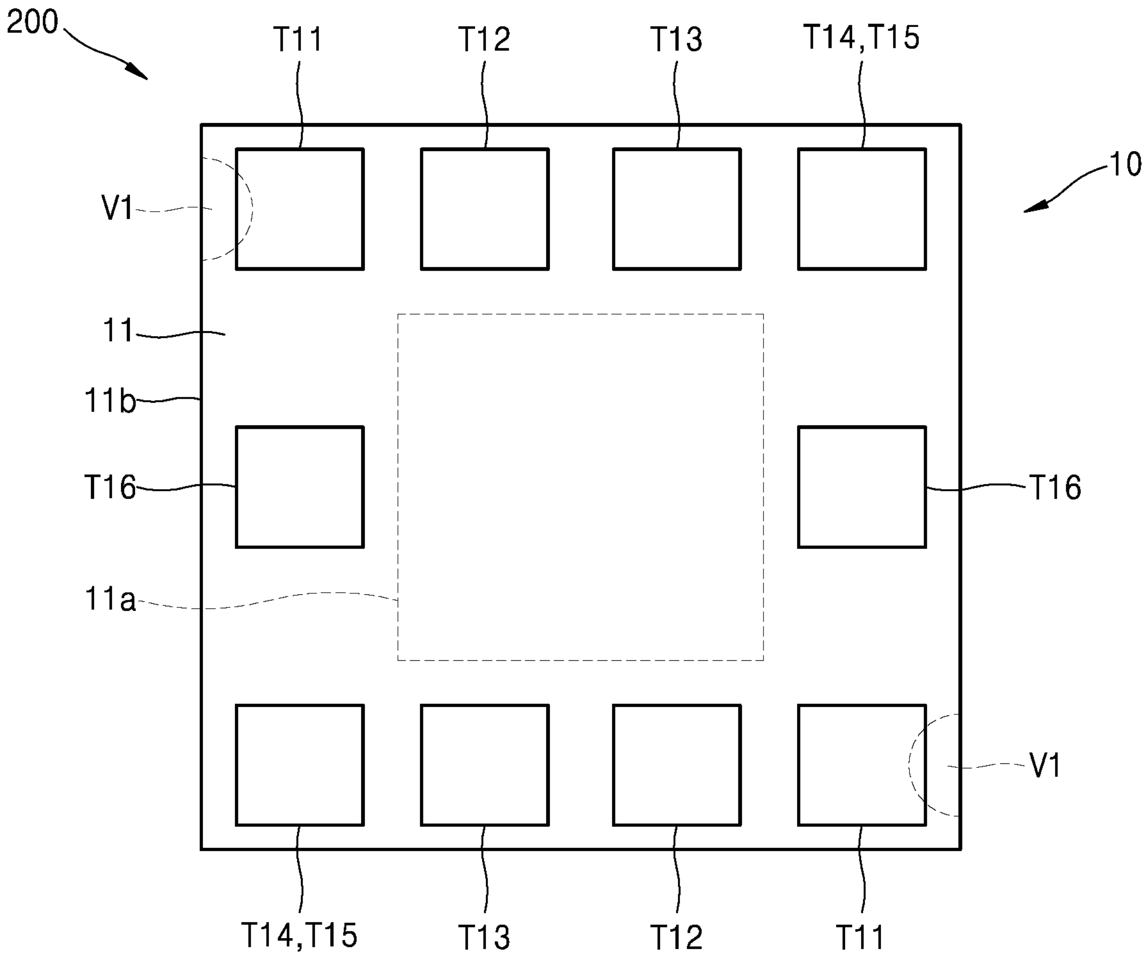
FIG. 6 illustrates a bottom view of a light-emitting stacked package having a driving circuit part according to some other embodiments of the present disclosure.

FIG. 6 illustrates a bottom view of a light-emitting stacked package 200 having a driving circuit part according to some other embodiments of the present disclosure.

As shown in FIG. 6, a first through electrode V1 of the light-emitting stacked package 200 having a driving circuit part according to some other embodiments of the present disclosure may be formed in a semicircular columnar or semipolygonal columnar shape along a side surface 11*b* of a semiconductor substrate 11 such that a first terminals T1 and a second terminal T2 can be electrically connected to each other.

Such the side-type first through electrode V1 may be cut by a cutting line L to be described below, and may also be referred to as a so-called side electrode.

Accordingly, the side-type first through electrode V1 may form a physically solid structure by reducing the number of through holes, or the size of the side-type first through electrode V1 may be increased, thereby increasing the safety of the manufacturing process and easily forming an electrode pattern.

Figure 7:
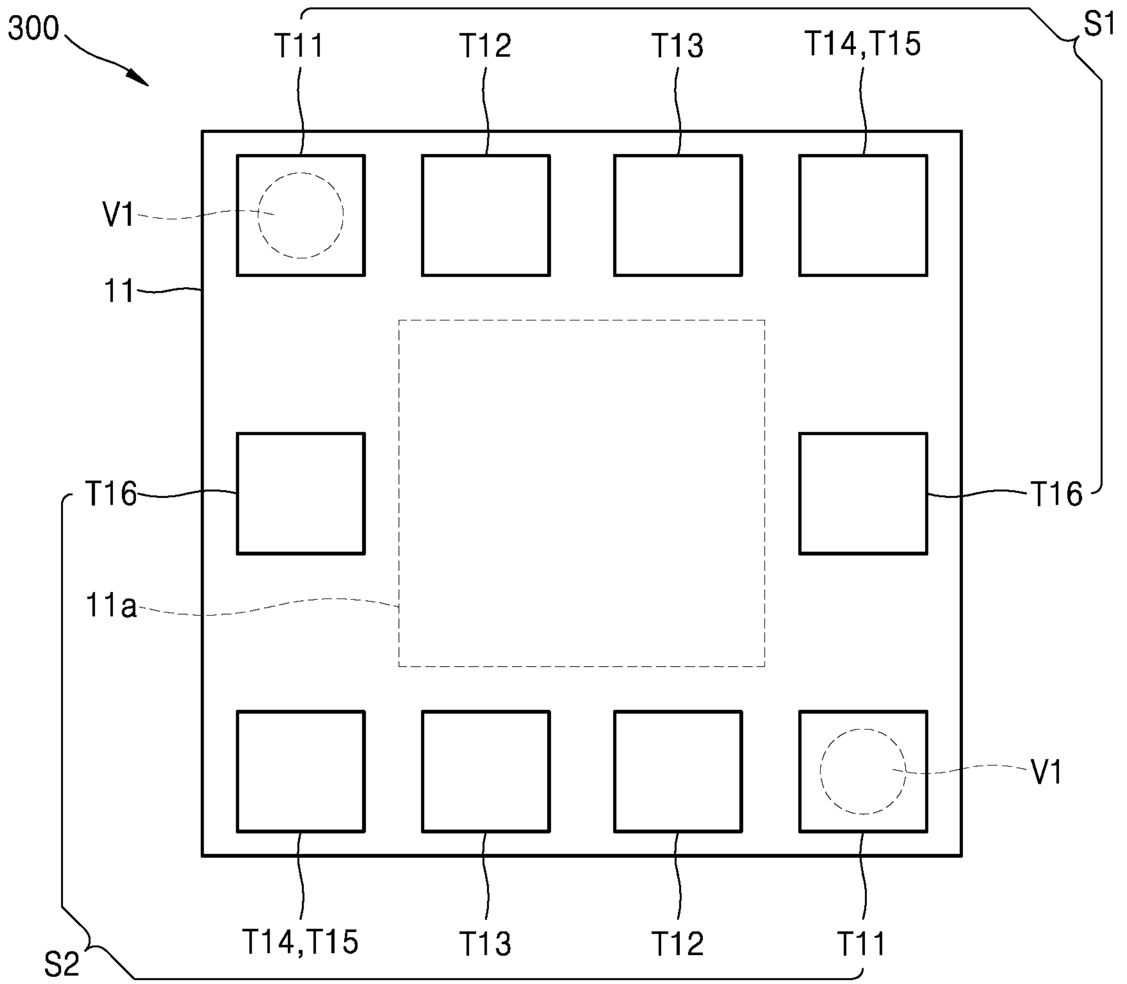
FIG. 7 illustrates a bottom view of the light-emitting stacked package having a driving circuit part according to some other embodiments of the present disclosure.

FIG. 7 illustrates a bottom view of the light-emitting stacked package 300 having a driving circuit part according to some other embodiments of the present disclosure.

As shown in FIG. 7, the first terminal T1 of the light-emitting stacked package 300 having a driving circuit part according to some other embodiments of the present disclosure may include a first terminal set S1 formed of at least one of a power terminal T11, a driving voltage terminal T12, a control terminal T13, a feedback terminal T14, a brightness adjustment terminal T15, a light intensity correction terminal T16, a dummy terminal (not shown) and combinations thereof; and a second terminal set S2 symmetrically arranged on a side opposite to the first terminal set S1 and composed of a combination of terminals identical to the first terminal set S1 or including a part of the first terminal set S1.

Therefore, the length of connection wires may be optimized by setting the terminals to be symmetrical with each other, and an optimal substrate may be designed by minimizing the overlapping of the connection wires.

Figure 8:
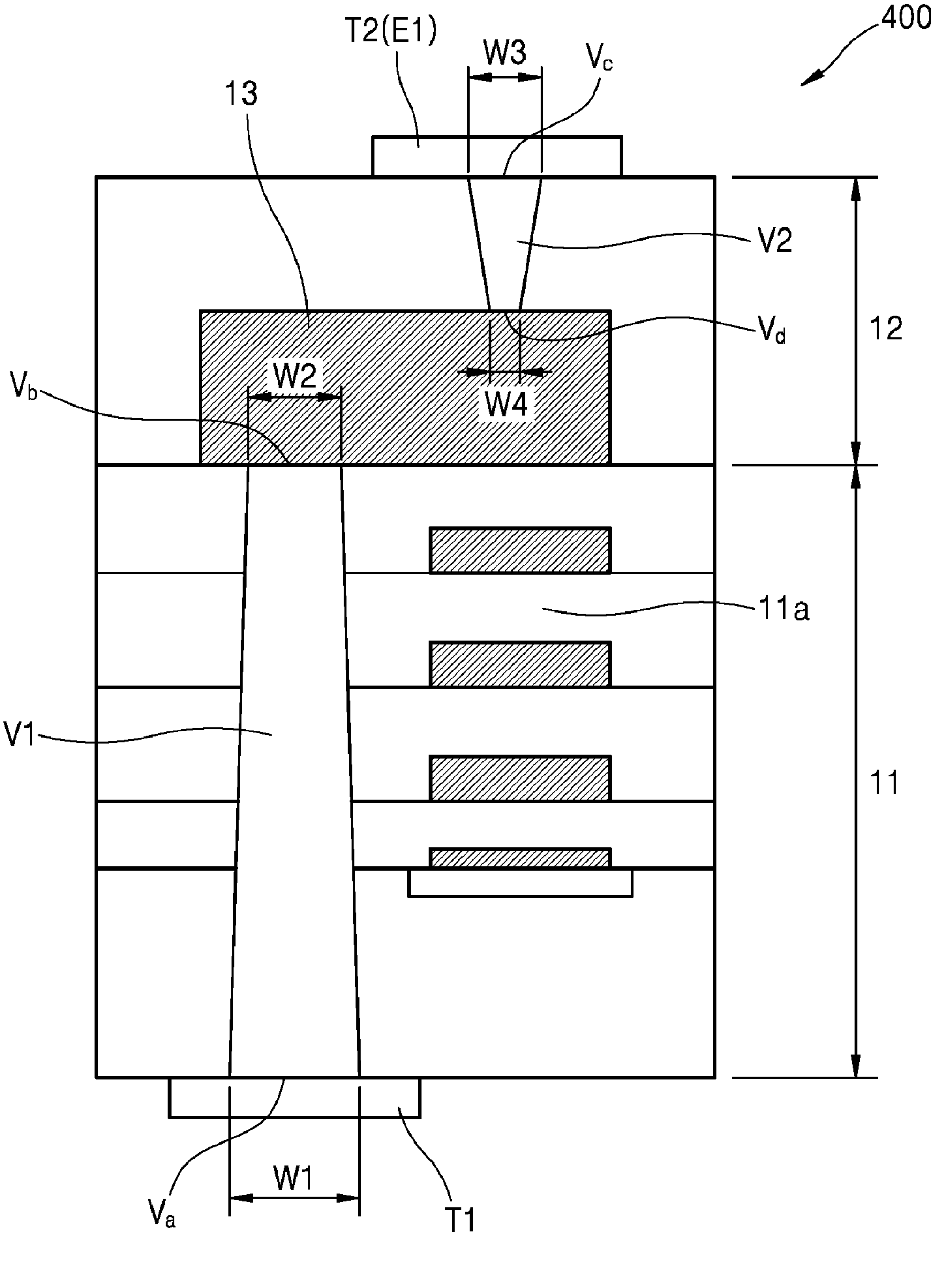
FIG. 8 illustrates a sectional view of a light-emitting stacked package having a driving circuit part according to some other embodiments of the present disclosure.

FIG. 8 illustrates a sectional view of a light-emitting stacked package 400 having a driving circuit part according to some other embodiments of the present disclosure.

As shown in FIG. 8, a driving circuit part 10 of the light-emitting stacked package 400 having a driving circuit part according to some other embodiments of the present disclosure may further include a redistribution insulating layer 12 that is formed between a second terminal T2 and a first through electrode V1 and includes a redistribution pad 13 connected to the first through electrode VI; and a second through electrode V2 that is formed in a shape penetrating the redistribution insulating layer 12 such that the redistribution pad 13 and the second terminal T2 are electrically connected and is formed in a shape that is out of sync with the first through electrode V1 to mitigate internal and external shocks.

Here, for example, the first through electrode V1 is a Through Silicon Via (TSV) that is formed by inverting a silicon wafer to form a through hole and then filling the inside of the through hole with a conductive material, and a first width W1 of a first portion Va connected to the first terminals T1 is formed wider than a second width W2 of a second portion Vb connected to the redistribution pad 13 to form a wedge shape as a whole, so that electrical resistance is reduced and electrical or physical stability is high, thereby greatly improving reliability.

In addition, for example, the second through electrode V2 is also a Through Silicon Via (TSV) that is formed by inverting a silicon wafer to form a through hole and then filling the inside of the through hole with a conductive material, and a fourth width W4 of a fourth portion Vd connected to the redistribution pad 13 is formed narrower than a third width W3 of a third portion Vc connected to the second terminal T2 to form a wedge shape as a whole, so that electrical resistance is reduced and electrical or physical stability is high, thereby greatly improving reliability.

Figure 9:
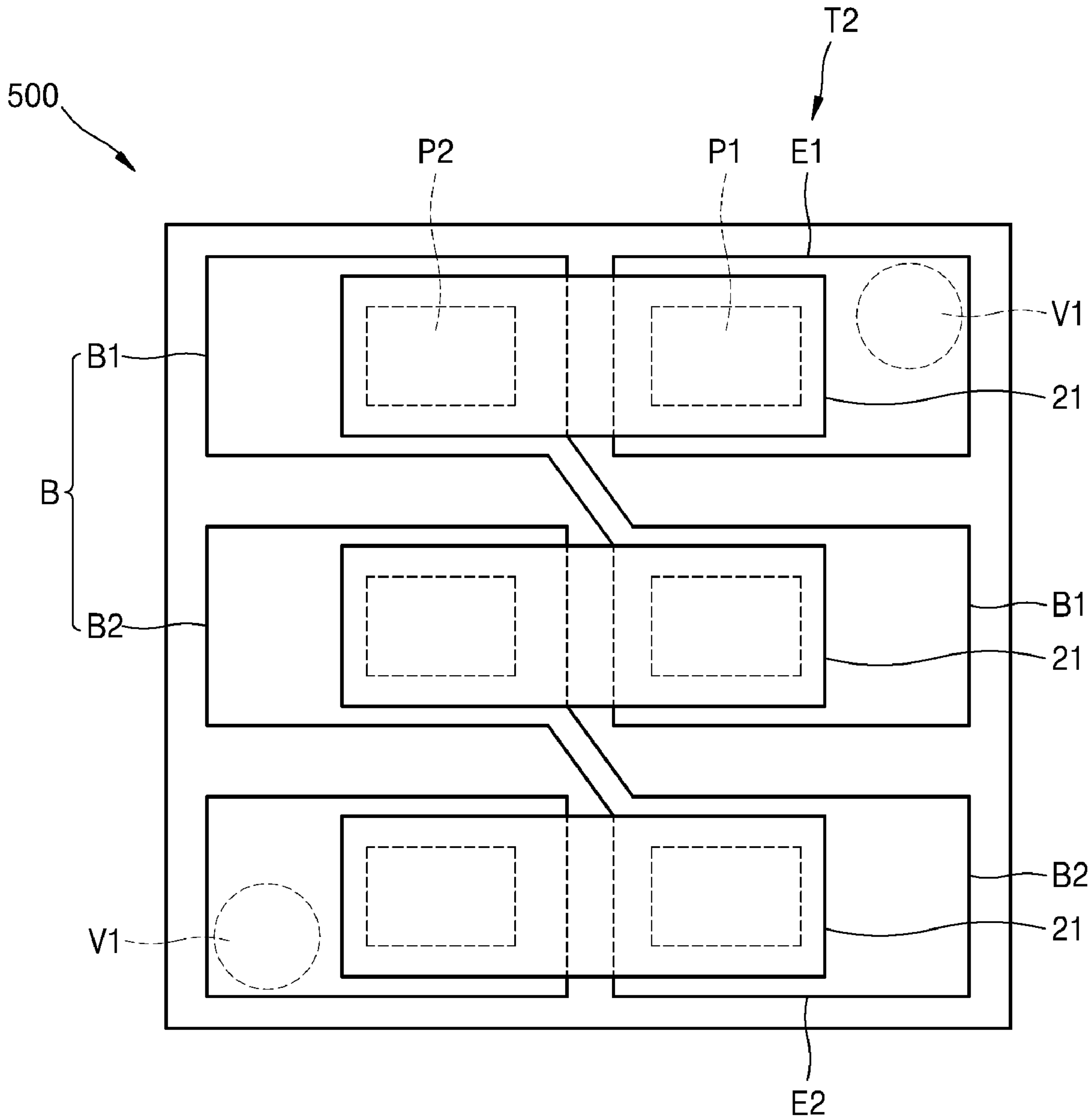
FIG. 9 is a plan view illustrating bridge terminals of a light-emitting stacked package having a driving circuit part according to some other embodiments of the present disclosure.

FIG. 9 is a plan view illustrating bridge terminals B of a light-emitting stacked package 500 having a driving circuit part according to some other embodiments of the present disclosure.

As shown in FIG. 9, a plurality of light-emitting elements 21 may be further installed in addition to the light-emitting element 21 installed between the first electrode E1 and the second electrode E2. For example, the plural light-emitting elements 21 may be connected in series using at least one bridge electrode B formed between the first electrode E1 and the second electrode E2.

The bridge electrode B may serve as an intermediate terminal to connect the light-emitting element 21 and the light-emitting element 21 adjacent thereto and, for example, may include a first bridge electrode B1 and second bridge electrode B2 that connect three light-emitting elements 21 of FIG. 9 in series.

However, the number of the bridge electrodes and the number of the light-emitting elements are not necessarily limited to those shown in the drawing, and bridge electrodes of a wide variety of numbers or shapes may be applied.

Figure 10:
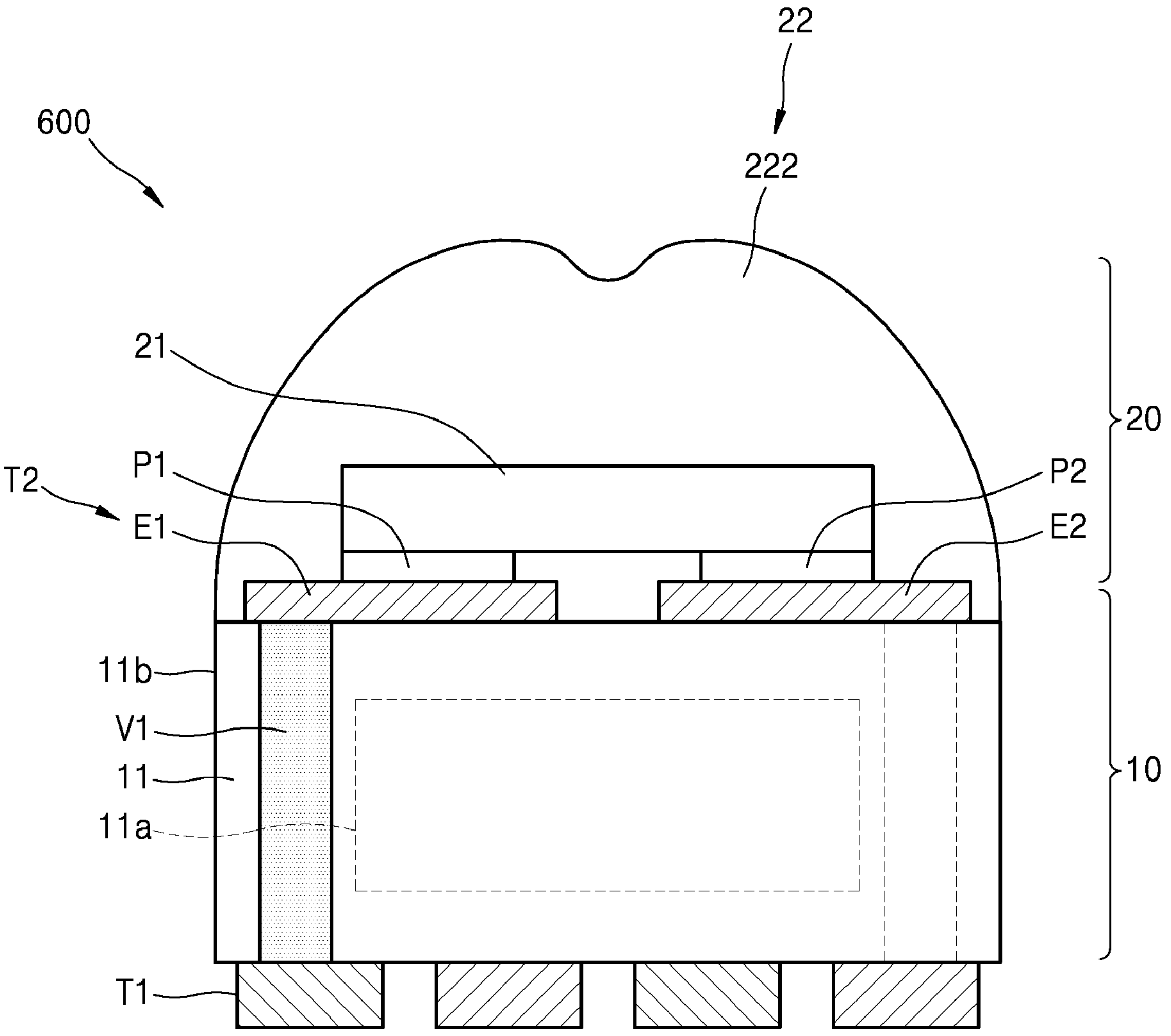
FIG. 10 is a sectional view illustrating a light-emitting stacked package having a driving circuit part according to some other embodiments of the present disclosure.

FIG. 10 is a sectional view illustrating a light-emitting stacked package 600 having a driving circuit part according to some other embodiments of the present disclosure.

As shown in FIG. 10, a protective member 22 of the light-emitting stacked package 600 having a driving circuit part according to some other embodiments of the present disclosure may be applied with a lens member 222 in addition to the above-described light-transmitting molding member 221.

The lens member 222 may have various shapes in addition to a simple dome shape or the illustrated concave dome shape, so that a relatively uniform amount of light may be emitted from all angles and thus the beam angle may be widened.

Figure 11:
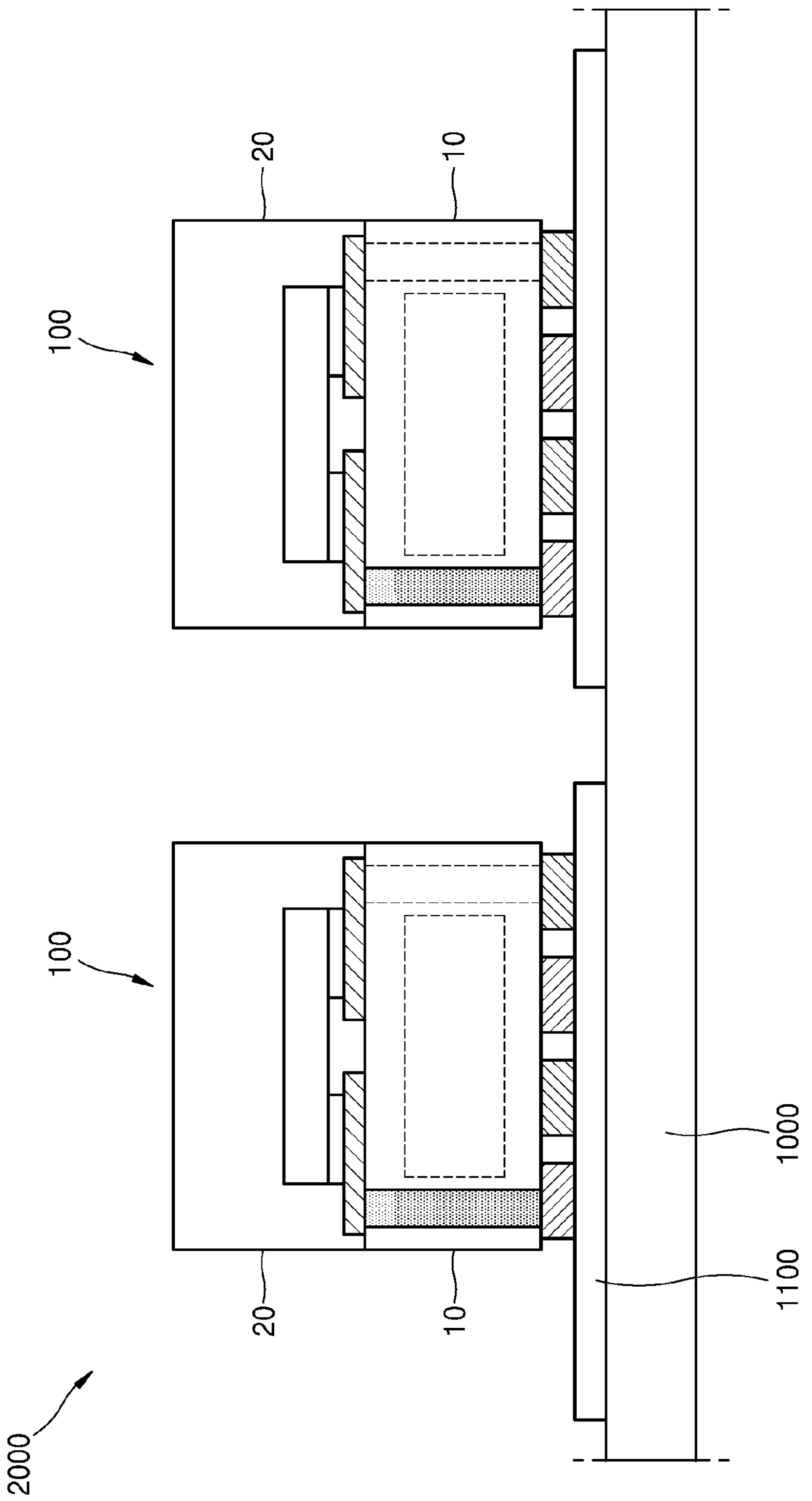
FIG. 11 is a sectional view illustrating a backlight unit according to some embodiments of the present disclosure.

FIG. 11 is a sectional view illustrating a backlight unit 2000 according to some embodiments of the present disclosure.

As shown in FIG. 11, a backlight unit 2000 according to some embodiments of the present disclosure may include a printed circuit substrate 1000 including at least one wiring layer 1100 connected to the plural light-emitting stacked packages 100 of FIG. 1 described above and the first terminals T1 of the light-emitting stacked packages 100.

Therefore, the plural light-emitting stacked packages 100, in which a driving circuit is embedded on the wiring layer 1100 of the printed circuit substrate 1000, may turn on/off the backlight for each pixel or block or individually control brightness therefor.

Although not shown, various light guide plates, diffusion sheets, prism sheets, etc. may be additionally installed in the backlight unit 2000 according to some embodiments of the present disclosure.

Figure 12:
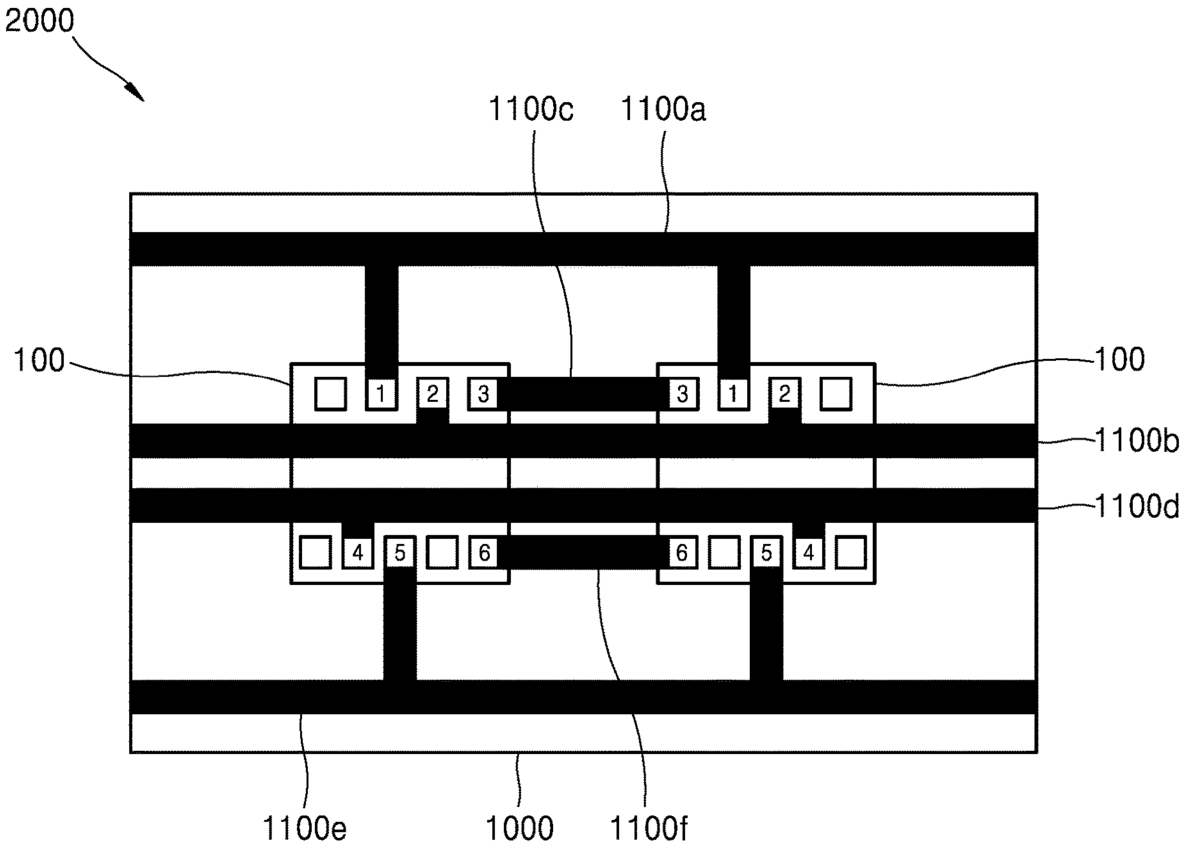
FIG. 12 is a plan view illustrating the backlight unit of FIG. 11.

FIG. 12 is a plan view illustrating the backlight unit 2000 of FIG. 11.

As shown in FIG. 12, in the printed circuit substrate 1000 of the backlight unit 2000 according to some embodiments of the present disclosure, wiring layers 1100 are electrically connected to the first terminals T1 of the light-emitting stacked packages 100. For example, a first wiring layer 1100*a* may be connected to terminals No. 1 of the light-emitting stacked packages 100, a second wiring layer 1100*b* may be connected to terminals No. 2 of the light-emitting stacked packages 100, a third wiring layer 1100*c* may be connected to terminals No. 3 of the light-emitting stacked packages 100, a fourth wiring layer 1100*d* may be connected to terminals No. 4 of the light-emitting stacked packages 100, a fifth wiring layer 1100*e* may be connected to terminals No. 5 of the light-emitting stacked packages 100, and a sixth wiring layer 1100*f* may be connected to terminals No. 6 of the light-emitting stacked packages 100.

Therefore, unlike existing technologies in which one drive IC drives several light-emitting elements, the wiring layer 1100 may be driven by connecting only the same type of terminals when using the light-emitting stacked packages 100 in which each of the light-emitting elements 21 is directly connected to a driving circuit part 11, so that the printed circuit substrate 1000 may be greatly simplified, thereby greatly improving productivity and reliability.

FIGS. 13 to 17 are sectional views sequentially illustrating a method of fabricating the light-emitting stacked package having a driving circuit part according to some embodiments of the present disclosure.

Figure 13:
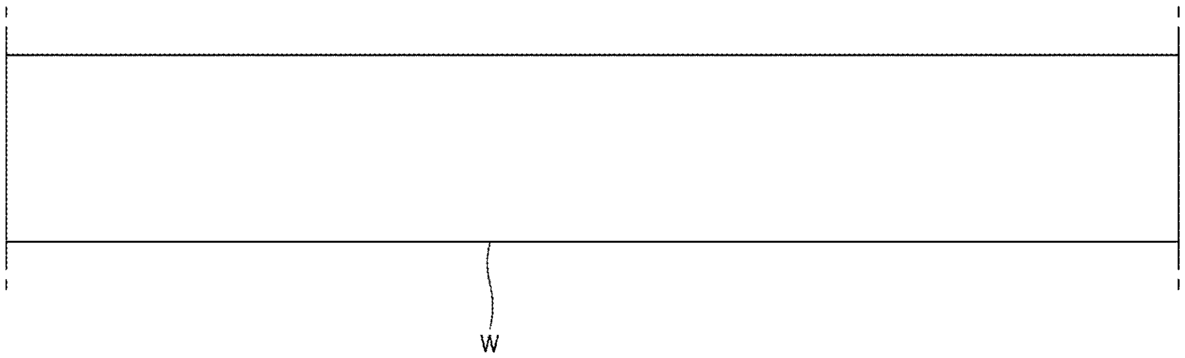
FIGS. 13 to 17 are sectional views sequentially illustrating a method of fabricating the light-emitting stacked package having a driving circuit part according to some embodiments of the present disclosure.

Referring to FIGS. 13 to 17, the method of fabricating the light-emitting stacked package having a driving circuit part according to some embodiments of the present disclosure is sequentially described as follows. First, as shown in FIG. 13, a semiconductor wafer W such as a silicon wafer may be prepared.

Figure 14:
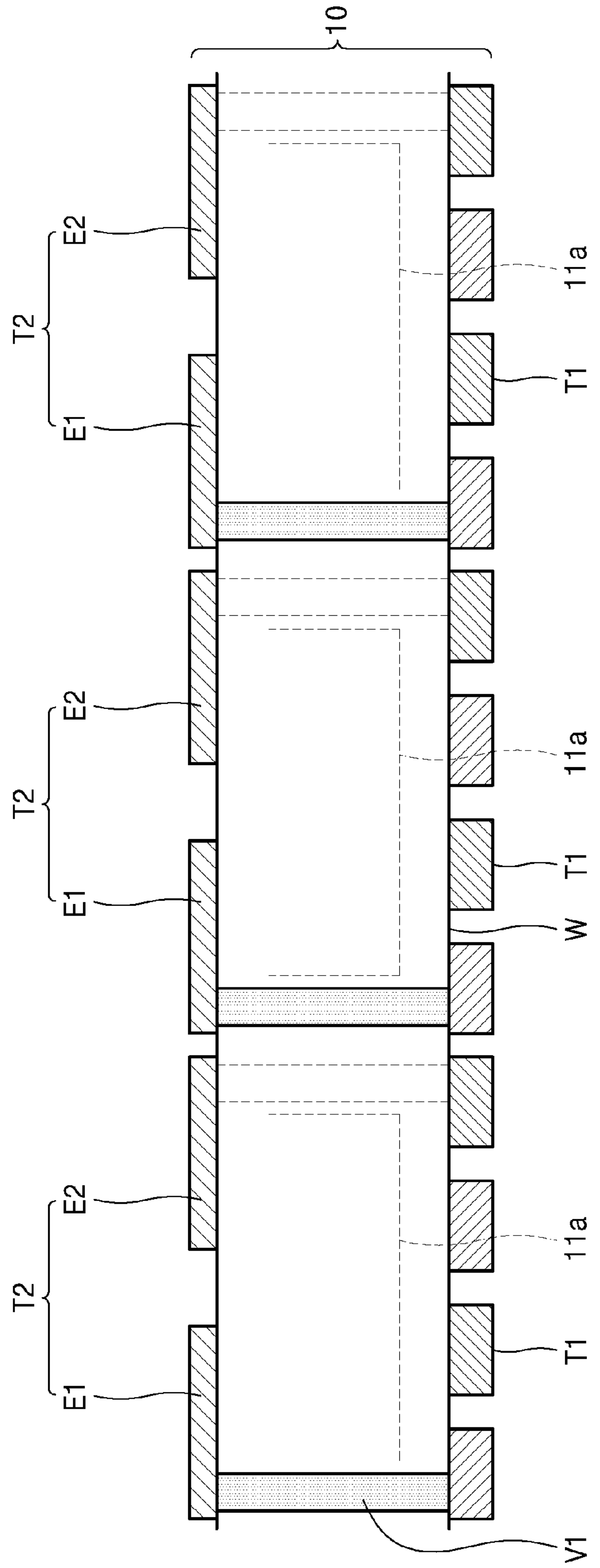

Next, as shown in FIG. 14, the driving circuit part 10 including at least one driving circuit 11*a* may be formed on the semiconductor wafer W using an integrated circuit process.

Here, the at least one first terminal T1 that receives power signals or input/output signals may be formed on one surface of the semiconductor substrate 11, the at least one first through electrode V1 may be formed in a shape penetrating the semiconductor substrate 11 or along a side surface of the semiconductor substrate 11, a mounting surface may be formed to mount the light-emitting element 21 on another surface of the semiconductor substrate 11, and the at least one second terminal T2 electrically connected to the first terminals T1 or the driving circuit 11*a* may be formed.

Figure 15:
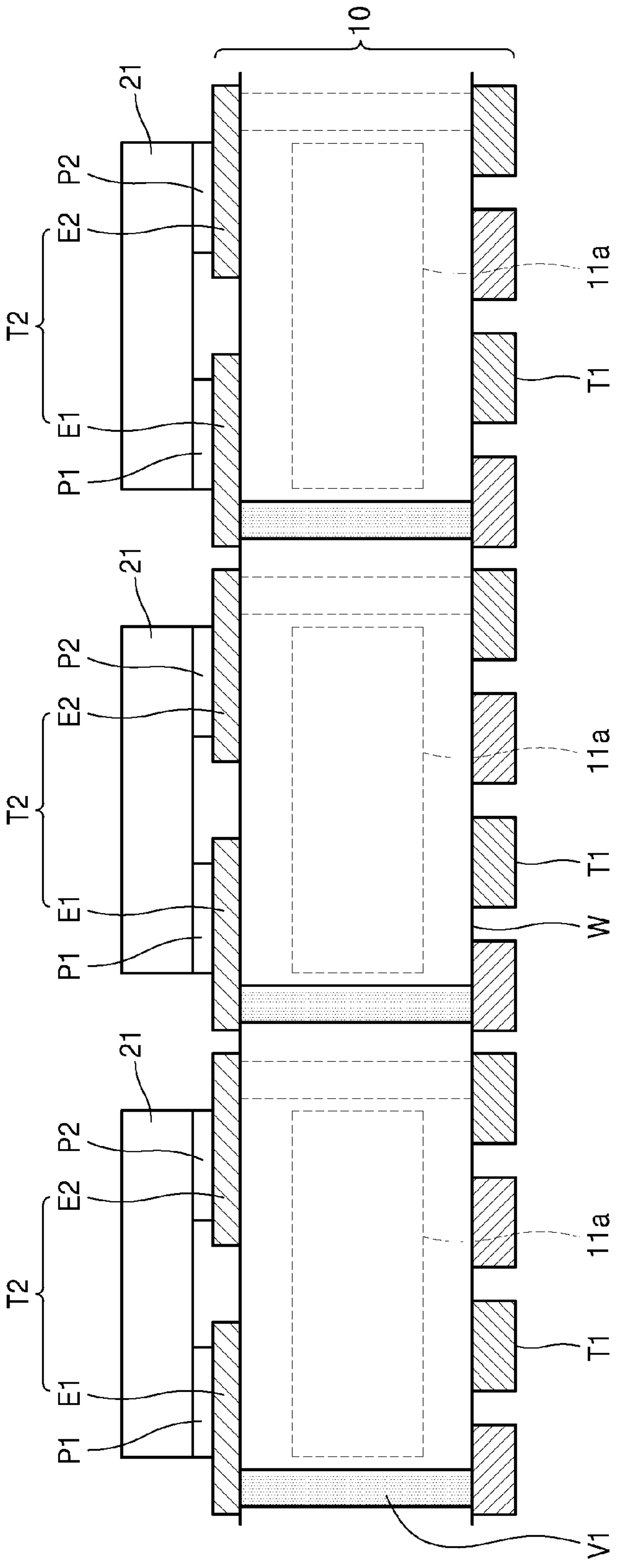

Next, as shown in FIG. 15, the light-emitting element 21, which is a flip chip type LED, may be chip-bonded or transferred to the second terminal T2 of the semiconductor substrate 11 to form the light-emitting element part 20 including the at least one light-emitting element 21 seated on and electrically connected to the driving circuit part 10 so as to receive driving power from the driving circuit part 10, and reflow or laser soldering may be performed so that the second terminal T2 and pads P1 and P2 of the light-emitting element 21 can be electrically connected.

Figure 16:
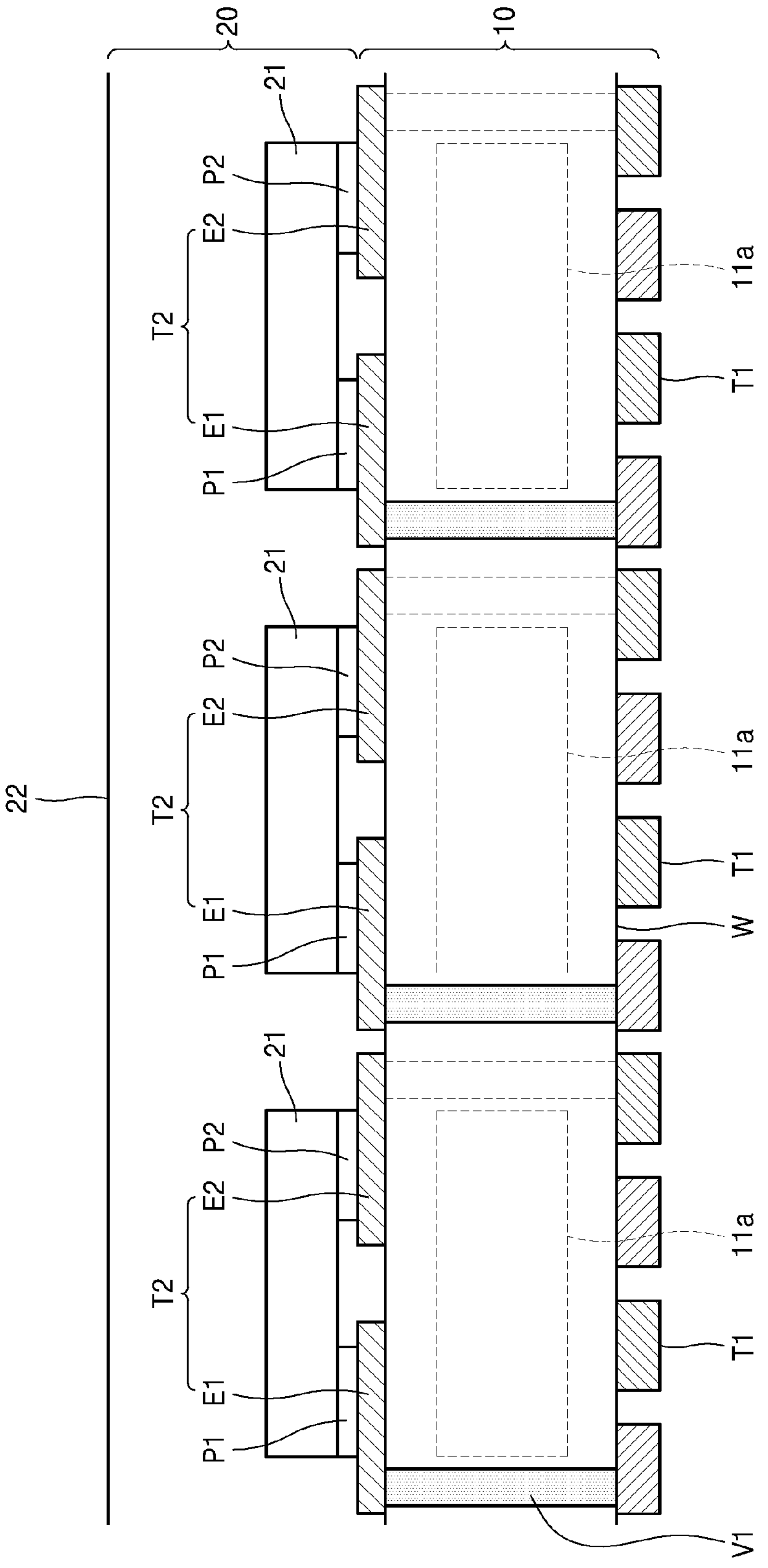

Next, as shown in FIG. 16, the protective member 22 may be injection-molded on the light-emitting element 21 or dispensed thereon by squeezing or coating.

Figure 17:
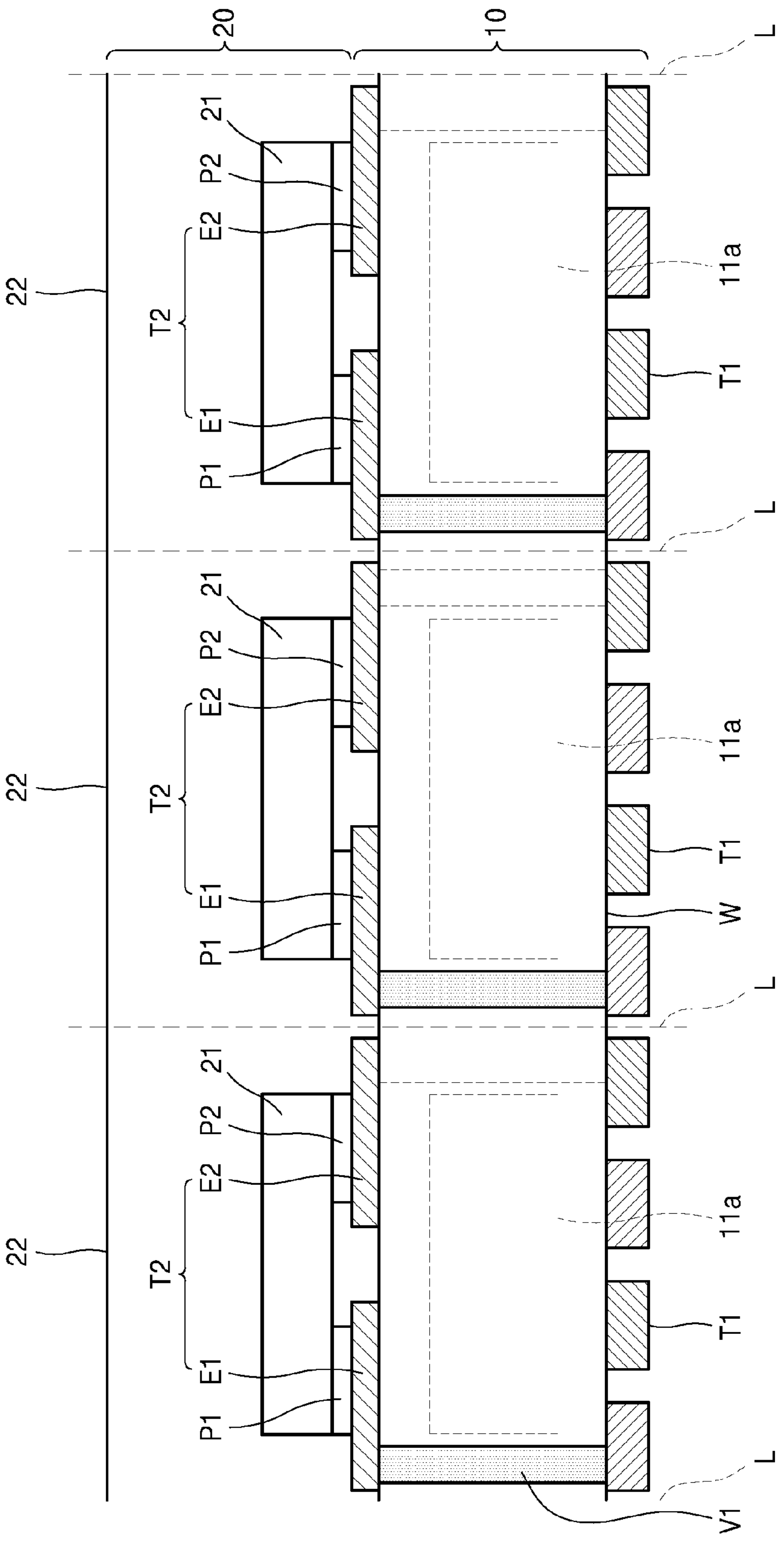

Next, as shown in FIG. 17, the semiconductor wafer W and a protective member 12 may be cut into a plurality of unit packages along a cutting line with a blade or a laser.

Figure 18:
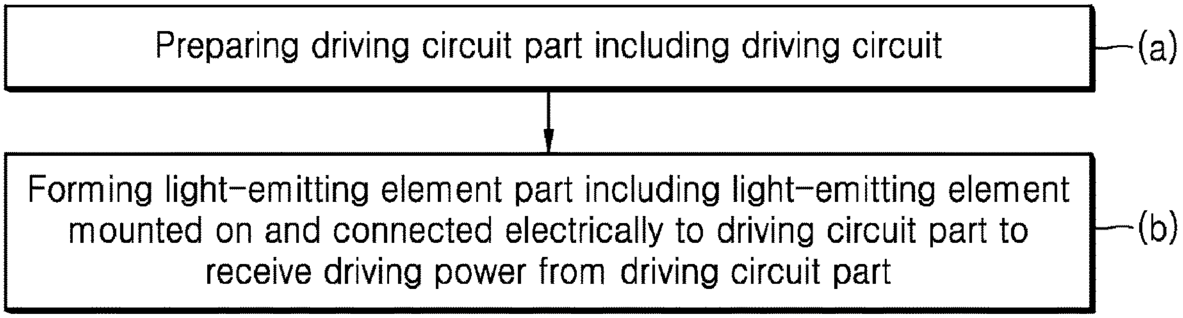
FIG. 18 illustrates a flowchart of the method of fabricating a light-emitting stacked package having a driving circuit part according to some embodiments of the present disclosure.

FIG. 18 illustrates a flowchart of the method of fabricating a light-emitting stacked package having a driving circuit part according to some embodiments of the present disclosure.

As shown in FIGS. 1 to 18, the method of fabricating a light-emitting stacked package having a driving circuit part according to some embodiments of the present disclosure may include (a) preparing a driving circuit part 10 including at least one driving circuit 11*a*; and (b) forming a light-emitting element part 20 including at least one light-emitting element 21 mounted on and connected electrically to the driving circuit part 10 to receive driving power from the driving circuit part 10.

Figure 19:
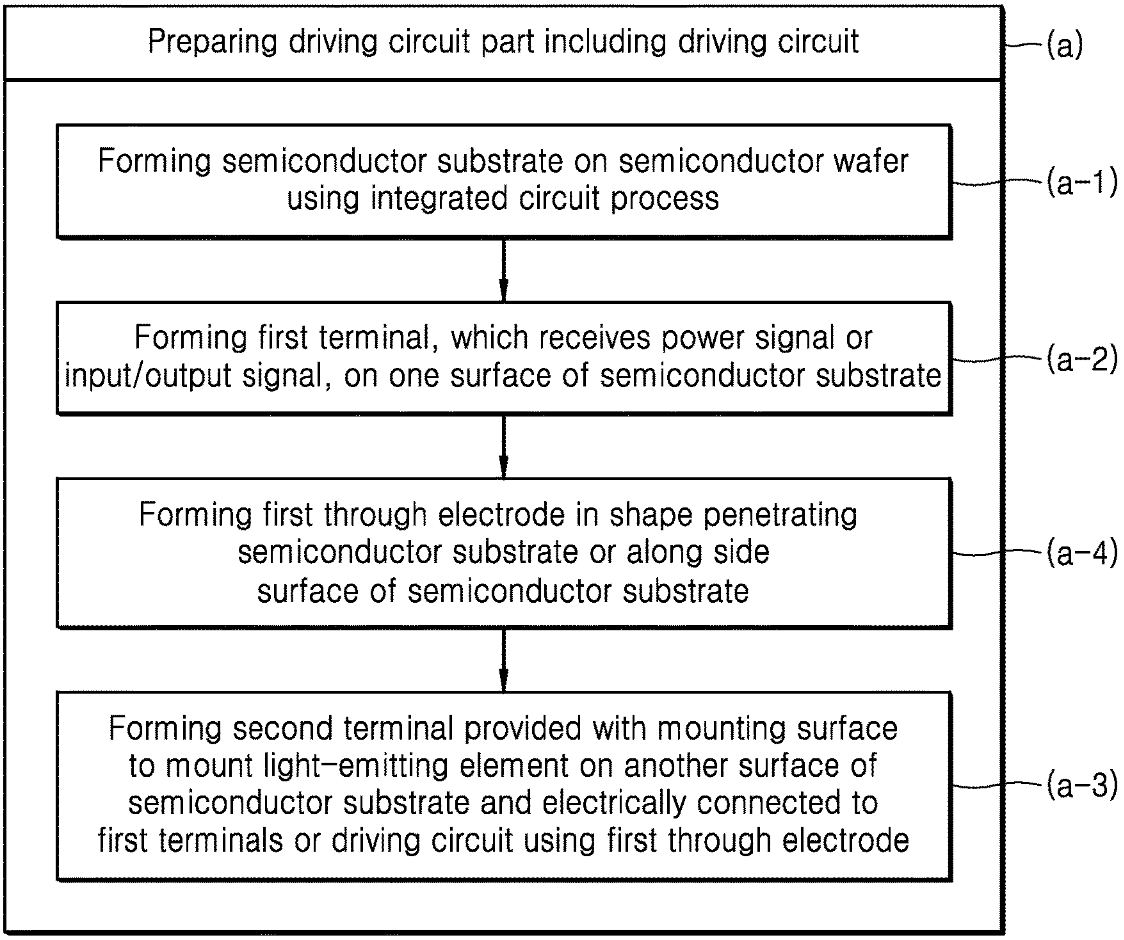
FIG. 19 illustrates a flowchart of an embodiment of the step (a) of the method of fabricating a light-emitting stacked package having a driving circuit part of FIG. 18.

FIG. 19 illustrates a flowchart of an embodiment of the step (a) of the method of fabricating a light-emitting stacked package having a driving circuit part of FIG. 18.

As shown in FIG. 19, the step (a) may include (a-1) forming a semiconductor substrate 11 on the semiconductor wafer W using an integrated circuit process, (a-2) forming at least one first terminal T1, which receives a power signal or an input/output signal, on one surface of the semiconductor substrate 11, and (a-3) forming a mounting surface to mount the light-emitting element 21 on another surface of the semiconductor substrate 11 and forming at least one second terminal T2 electrically connected to the first terminals T1 or the driving circuit 11*a*.

Here, the step (a) may further include (a-4) forming at least one first through electrode V1 into a shape penetrating the semiconductor substrate 11 or along a side surface of the semiconductor substrate 11 so that the first terminals T1 and the second terminal T2 can be electrically connected, after the step (a-2).

Figure 20:
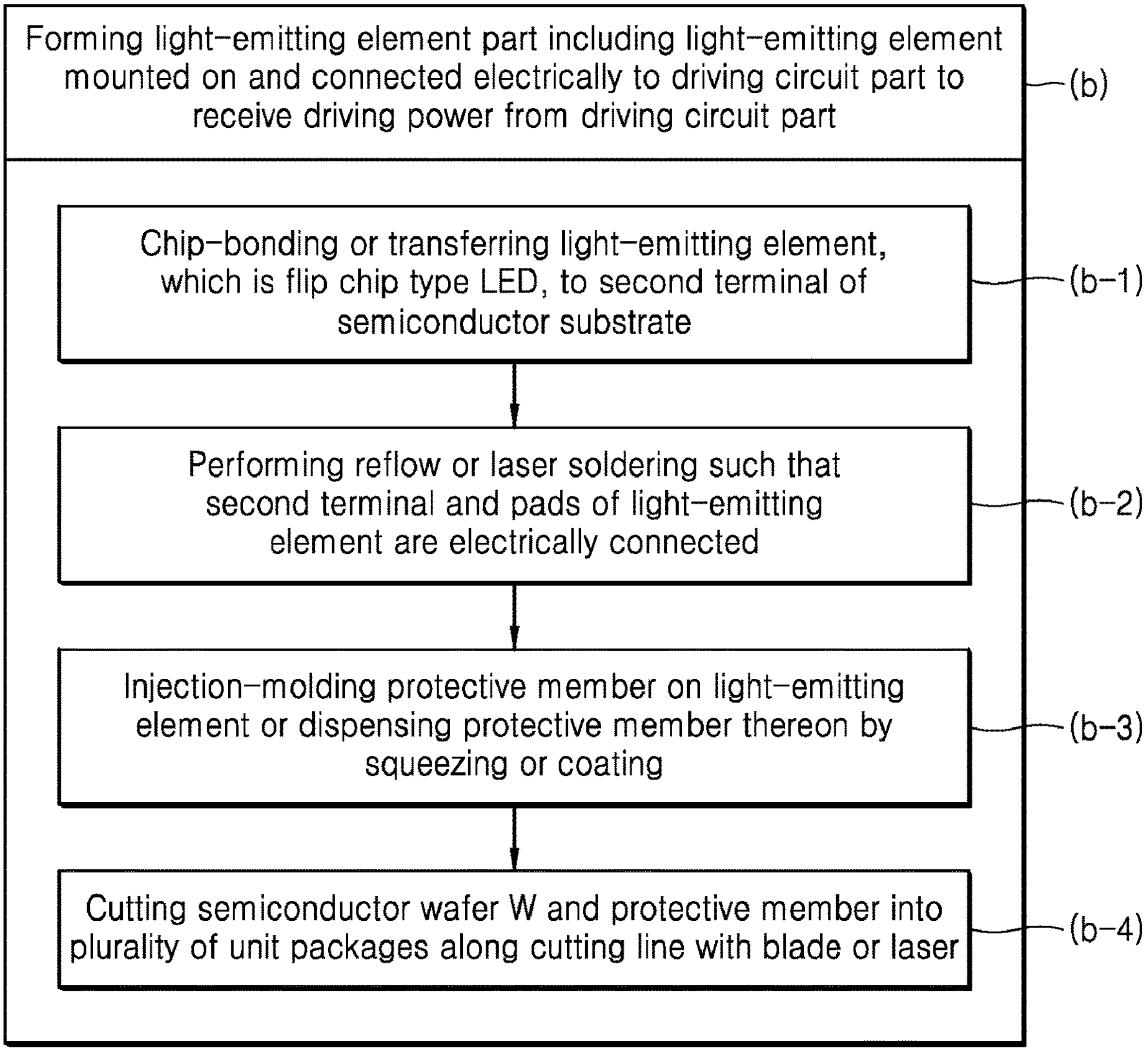
FIG. 20 illustrates a flowchart of an embodiment of the step (b) of the method of fabricating a light-emitting stacked package having a driving circuit part of FIG. 18.

FIG. 20 illustrates a flowchart of an embodiment of the step (b) of the method of fabricating a light-emitting stacked package having a driving circuit part of FIG. 18.

As shown in FIGS. 1 to 20, the step (b) may include (b-1) chip-bonding or transferring the light-emitting element 21, which is an LED in the form of a flip chip, to the second terminal T2 of the semiconductor substrate 11; (b-2) performing reflow or laser soldering such that the second terminal T2 and pads P1 and P2 of the light-emitting element 21 can be electrically connected; (b-3) injection-molding a protective member 22 on the light-emitting element 21 or dispensing thereon by squeezing or coating; and (b-4) cutting the semiconductor wafer W and the protective member 12 into a plurality of unit packages along a cutting line with a blade or a laser.

In accordance with an embodiment of the present disclosure configured as described above, a local dimming backlight including a plurality of control elements can be realized by mounting a light-emitting element on a semiconductor chip, on which a driving circuit is formed, through the Chip Scale Package (CSP) process so that light extraction efficiency can be greatly improved by reducing a wiring length, it is possible to implement a thin display and design an ultra-thin package of multicolor or monochromatic light-emitting diodes with a minimum number of components by minimizing the optical distance of a backlight, a light beam angle can be improved by forming various optical systems such as a light-diffusing lens or a side-reflection type optical system on a light-emitting surface, a thinner and more uniform surface light source can be realized with fewer light-emitting devices, a black-and-white contrast ratio (black contrast) can be maximized by realizing multiple local dimming with the same local dimming number and light source number, difficulties such as mounting space limitations, circuit complexity, and unit price increase when manufacturing modules can be dramatically reduced, more levels of contrast ratio can be achieved by including a control element (drive circuit) with a structure that maximizes the control level of light brightness, and a feedback terminal and terminals, power and ground terminals for multiple functions, etc. can be configured in various ways for accurate control. Of course, the scope of the present disclosure is not limited by these effects.

Although the present disclosure has been described with reference to embodiments shown in the drawings, the embodiments are provided as only exemplary examples, and those skilled in the art will understand that various modifications and equivalent other embodiments are possible therefrom. Therefore, the true technical protection scope of the present disclosure should be determined by the technical spirit of the appended claims.

DESCRIPTION OF SYMBOLS

10: driving circuit part
W: semiconductor wafer
11: semiconductor substrate
11*a*: driving circuit
11*b*: side surface
T1: first terminals
T11: power terminal
T12: driving voltage terminal
T13: control terminal
T14: feedback terminal T15: brightness adjustment terminal
T16: light intensity correction terminal
T2: second terminal
E1: first electrode
E2: second electrode
V1: first through electrode
12: redistribution insulating layer
13: redistribution pad
V2: second through electrode
Va: first portion
Vb: second portion
Vc: third portion
Vd: fourth portion
W1: first width
W2: second width
W3: third width
W4: fourth width
S1: first terminal set
S2: second terminal set
B: bridge electrode
B1: first bridge electrode
B2: second bridge electrode
20: light-emitting element part
21: light-emitting element
P1: first pad
P2: second pad
22: protective member
221: light-transmitting molding member
222: lens member
100-600: light-emitting stacked package
1100: wiring layer
1000: printed circuit substrate
2000: backlight unit
L: cutting line

What is claimed is:

1. A light-emitting stacked package having a driving circuit part, the light-emitting stacked package comprising:
the driving circuit part comprising:
at least one driving circuit;
a semiconductor substrate formed on a semiconductor wafer using an integrated circuit process;
at least one first terminal disposed on one surface of the semiconductor substrate and configured to receive power signals or input/output signals; and
at least one second terminal disposed on another surface of the semiconductor substrate, provided with a mounting surface on which at least one light-emitting element is mounted, and electrically connected to the at least one first terminal or the at least one driving circuit;
a light-emitting element part comprising the at least one light-emitting element seated on and electrically connected to the driving circuit part to be supplied with driving power from the driving circuit part,
wherein the at least one first terminal includes:
a first terminal set comprising at least two terminals selected from a power terminal, a driving voltage terminal, a control terminal, a feedback terminal, a brightness adjustment terminal, a light intensity correction terminal, a dummy terminal, and combinations thereof; and
a second terminal set symmetrically arranged on a side opposite to the first terminal set, the second terminal set comprising a combination of terminals identical to the first terminal set,
wherein the first terminal set and the second terminal set share an identical terminal ordering, reflecting an ordering of the at least two terminals in the first terminal set within the second terminal set.

2. The light-emitting stacked package according to claim 1, wherein the driving circuit part further comprises at least one first through electrode formed to penetrate the semiconductor substrate or disposed along a side surface of the semiconductor substrate to electronically connect the at least one first terminal and the at least one second terminal.

3. The light-emitting stacked package according to claim 2, wherein the at least one first terminal is disposed on an edge portion of the one surface of the semiconductor substrate, and the at least one first through electrode is formed to avoid the at least one driving circuit formed in a central portion of the semiconductor substrate or formed on the side surface of the semiconductor substrate.

4. The light-emitting stacked package according to claim 1, wherein the driving circuit part further comprises a redistribution insulating layer formed between the at least one second terminal and a first through electrode and configured to comprise a redistribution pad connected to the first through electrode.

5. The light-emitting stacked package according to claim 4,
wherein the driving circuit part further comprises a second through electrode penetrating the redistribution insulating layer to electronically connect the redistribution pad and the at least one second terminal, the second through electrode formed in a shape that is out of sync with the first through electrode to mitigate internal and external shocks.

6. The light-emitting stacked package according to claim 5, wherein in the first through electrode, a first width of a first portion connected to the at least one first terminal is formed wider than a second width of a second portion connected to the redistribution pad.

7. The light-emitting stacked package according to claim 5, wherein a fourth width of a fourth portion connected to the redistribution pad is formed narrower than a third width of a third portion connected to the at least one second terminal.

8. The light-emitting stacked package according to claim 1, wherein the at least one second terminal comprises:
a first electrode connected to a first pad of the at least one light-emitting element; and
a second electrode formed to be spaced apart from the first electrode by using an electrode separation space and connected to a second pad of the at least one light-emitting element.

9. The light-emitting stacked package according to claim 8, wherein a plurality of light-emitting elements are connected in parallel between the first electrode and the second electrode or connected in series between the first electrode and the second electrode using at least one bridge electrode.

10. The light-emitting stacked package according to claim 1, wherein the light-emitting element part comprises:
the at least one light-emitting element, which is a flip chip type LED, comprising a first pad and second pad formed on a lower surface thereof; and
a protective member serving to protect the at least one light-emitting element.

11. The light-emitting stacked package according to claim 10, wherein the protective member comprises at least one of a light-transmitting molding member made of a light-transmitting material comprising silicone or epoxy; a lens member; a light conversion member comprising a fluorescent material or quantum dot; a color filter member; an optical system; a reflective wall member; and combinations thereof.

12. A backlight unit, comprising:

a plurality of light-emitting stacked packages as disclosed in claim 1; and a printed circuit substrate comprising at least one wiring layer connected to terminals of the plurality of light-emitting stacked packages.

13. The light-emitting stacked package according to claim 5, wherein the first through electrode is formed in a wedge shape having a first width at a first portion connected to the at least one first terminal wider than a second width at a second portion connected to the redistribution pad, and the second through electrode is formed in an opposing wedge shape having a third width at a third portion connected to the at least one second terminal wider than a fourth width at a fourth portion connected to the redistribution pad to reduce electrical resistance and increase physical stability.

14. The light-emitting stacked package according to claim 2, wherein the first through electrode having a semi-circular or semi-polygonal columnal shape is disposed along the side surface of the semiconductor substrate.

* * * * *